(12) United States Patent
Tanabe et al.

(10) Patent No.: US 6,596,650 B2
(45) Date of Patent: *Jul. 22, 2003

(54) METHOD FOR FABRICATING SEMICONDUCTOR INTEGRATED CIRCUIT DEVICE

(75) Inventors: Yoshikazu Tanabe, Iruma (JP); Satoshi Sakai, Ome (JP); Nobuyoshi Natsuaki, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/939,600

(22) Filed: Aug. 28, 2001

(65) Prior Publication Data

US 2002/0009898 A1 Jan. 24, 2002

Related U.S. Application Data

(63) Continuation of application No. 09/494,036, filed on Jan. 31, 2000, which is a continuation of application No. 09/380,646, filed as application No. PCT/JP98/00892 on Mar. 4, 1998, now Pat. No. 6,239,041.

(30) Foreign Application Priority Data

Mar. 5, 1997 (JP) ............................................. 9-50781

(51) Int. Cl.$^7$ ............................................. H01L 21/316
(52) U.S. Cl. ..................... 438/770; 438/663; 438/773; 438/774; 438/787; 438/795; 438/935
(58) Field of Search ................................. 438/663, 770, 438/773, 774, 787, 795, 935

(56) References Cited

U.S. PATENT DOCUMENTS

| | | |
|---|---|---|
| 4,139,658 A | 2/1979 | Cohen et al. |
| 5,693,578 A | 12/1997 | Nakanishi et al. |
| 5,751,025 A | 5/1998 | Heminger et al. |
| 5,786,263 A | 7/1998 | Perera |
| 5,840,368 A | 11/1998 | Ohmi |
| 5,851,892 A | 12/1998 | Lojek et al. |
| 5,880,041 A | 3/1999 | Ong |
| 6,239,041 B1 * | 5/2001 | Tanabe et al. ............... 438/773 |
| 6,362,086 B2 | 3/2002 | Weimer et al. |

FOREIGN PATENT DOCUMENTS

| | | |
|---|---|---|
| JP | 59-132136 | 7/1984 |
| JP | 60-107840 | 6/1985 |
| JP | 5-114740 | 5/1993 |
| JP | 5-141871 | 6/1993 |
| JP | 5-144804 | 6/1993 |
| JP | 5-152282 | 6/1993 |
| JP | 6-115903 | 4/1994 |
| JP | 6-120206 | 4/1994 |
| JP | 6-163517 | 6/1994 |
| JP | 6-333918 | 12/1994 |

(List continued on next page.)

OTHER PUBLICATIONS

Tanabe et al., PG Pub: US 2002/0004315 A1, Jan. 10, 2002.*
Tanabe et al., PG Pub: US 2002/0019149 A1, Feb. 14, 2002.*

(List continued on next page.)

*Primary Examiner*—Kamand Cuneo
*Assistant Examiner*—Lisa Kilday
(74) *Attorney, Agent, or Firm*—Antonelli, Terry, Stout & Kraus, LLP

(57) ABSTRACT

A method for fabricating a semiconductor integrated circuit device of the invention comprises feeding oxidation species containing a low concentration of water, which is generated from hydrogen and oxygen by the catalytic action, to the main surface of or in the vicinity of a semiconductor wafer, and forming a thin oxide film serving as a gate insulating film of an MOS transistor and having a thickness of 5 nm or below on the main surface of the semiconductor wafer at an oxide film-growing rate sufficient to ensure fidelity in formation of an oxide film and uniformity in thickness of the oxide film.

67 Claims, 21 Drawing Sheets

FOREIGN PATENT DOCUMENTS

| | | |
|---|---|---|
| JP | 7-10935 | 2/1995 |
| JP | 7-86264 | 3/1995 |
| JP | 7-115069 | 5/1995 |
| JP | 7-193059 | 7/1995 |
| JP | 7-321102 | 12/1995 |
| JP | 8-111449 | 4/1996 |
| JP | 9-172011 | 6/1997 |
| WO | WO/9728085 | 7/1997 |

OTHER PUBLICATIONS

Tanabe et al., PG Pub: US 2001/0009813A1, Jul. 26, 2001.*
Tanabe et al., PG Pub: US 2001/0010975A1, Aug. 2, 2001.*
Tanabe et al., US PG Pub: US 2001/0024870A1, Sep. 27, 2001.*
Tanabe et al., PG Pub: US 2001*0006853A1, Jul. 5, 2001.*
Nakamura, et al., "Proceedings of the 45$^{th}$ Symposium on Semiconductors and Integrated Circuits Technology", Dec. 1–2, 1993. (full translation).

* cited by examiner

FIG. 11
(a)
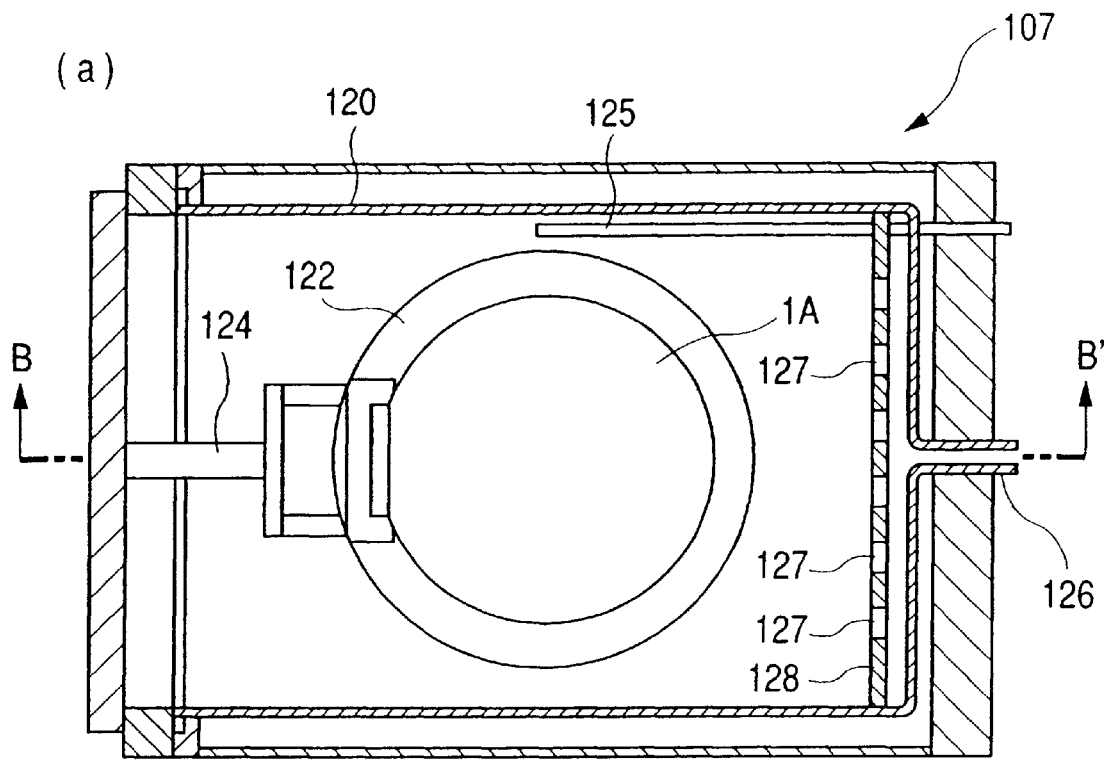
(b)
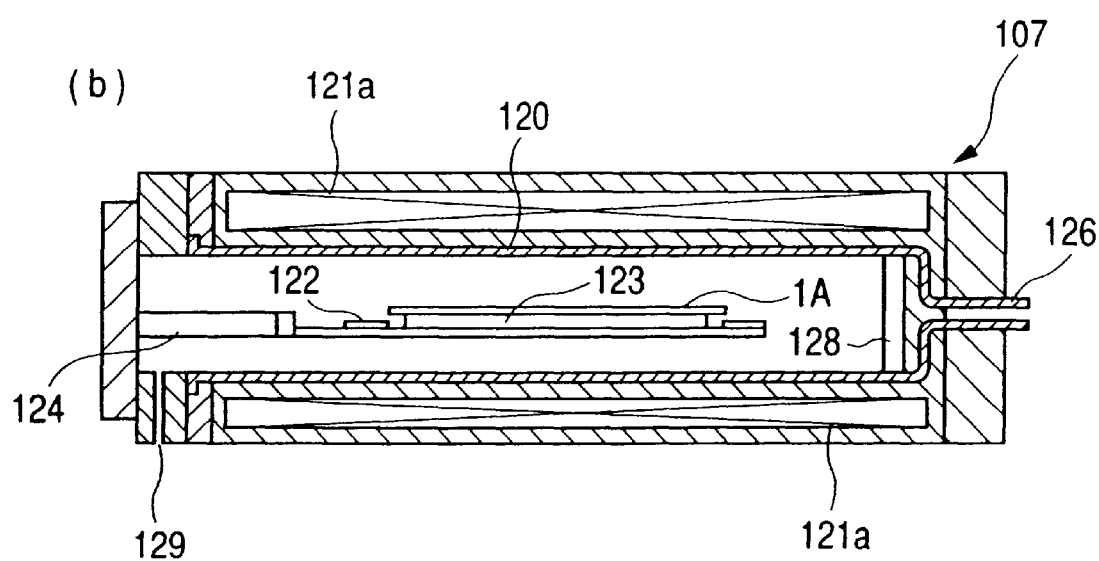

FIG. 12
(a)
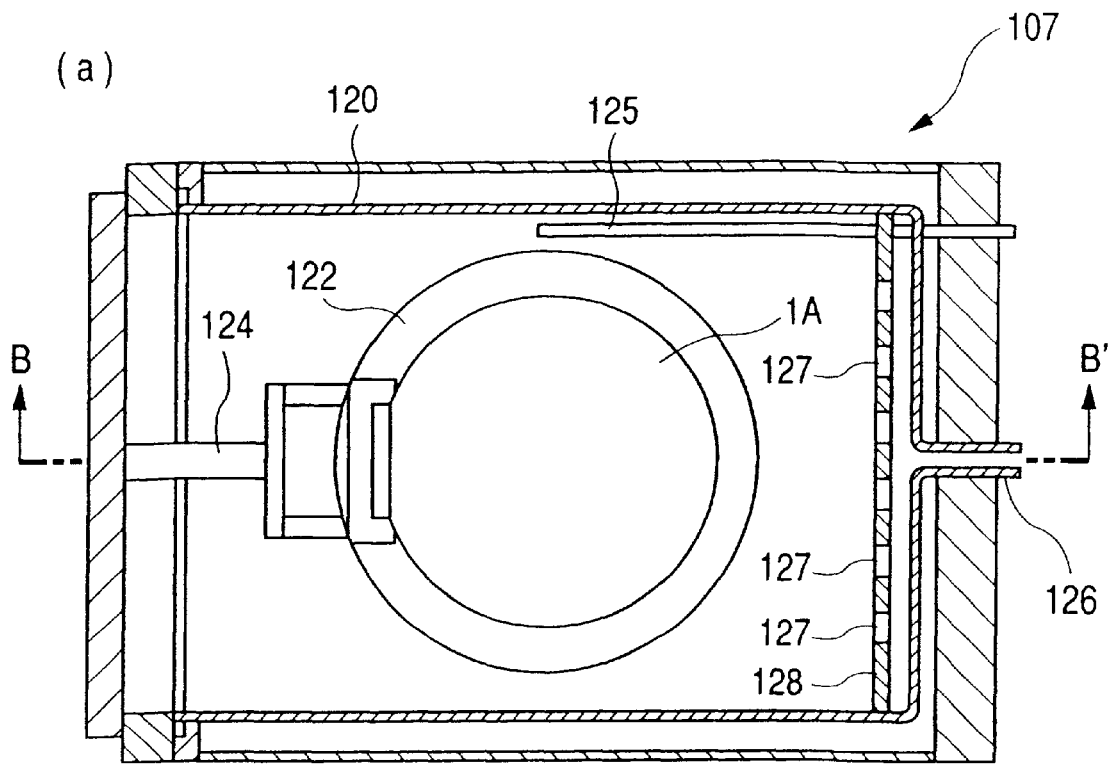
(b)
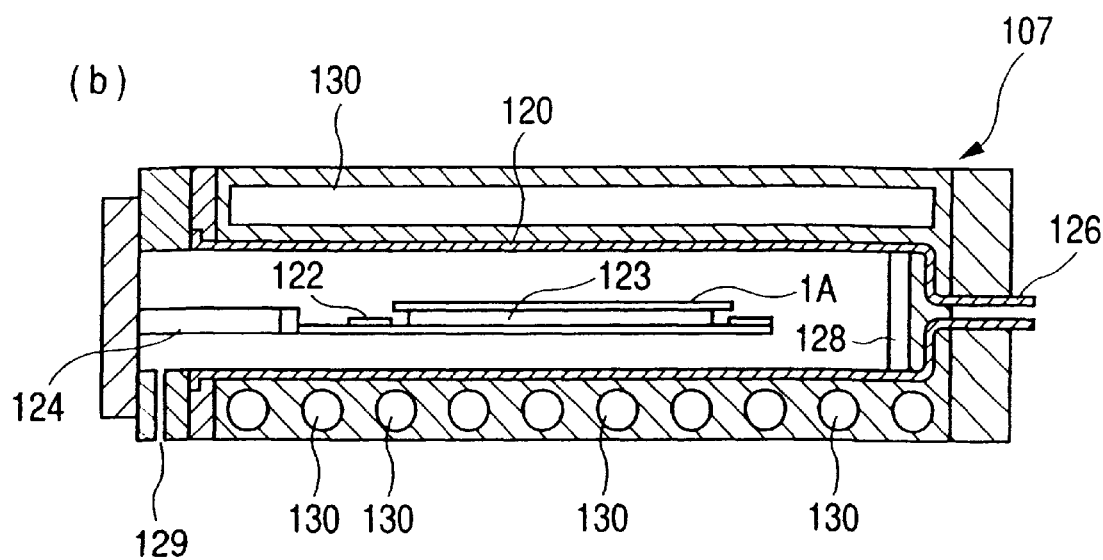

OXIDATION CONDITION DEPENDENCY
OF VOLTAGE CHANGE

PITCH OF CONTOUR LINES : 0.03nm

WAFER DIAMETER : 8 inch

AVERAGE : 2.848 [ nm ]
MAX. : 2.881 [ nm ]
MIN. : 2.814 [ nm ]
MAX. − MIN. : 0.067 [ nm ]
±1.18 [ % ]
TREATING CONDITIONS : 850°C, 2'30"
$H_2 / O_2$ : 0.05 / 4.9slm ( MOISTURE CONTENT : 0.8% )
MEASUREMENT : AT 49 POINTS BY ELLIPSOMETER

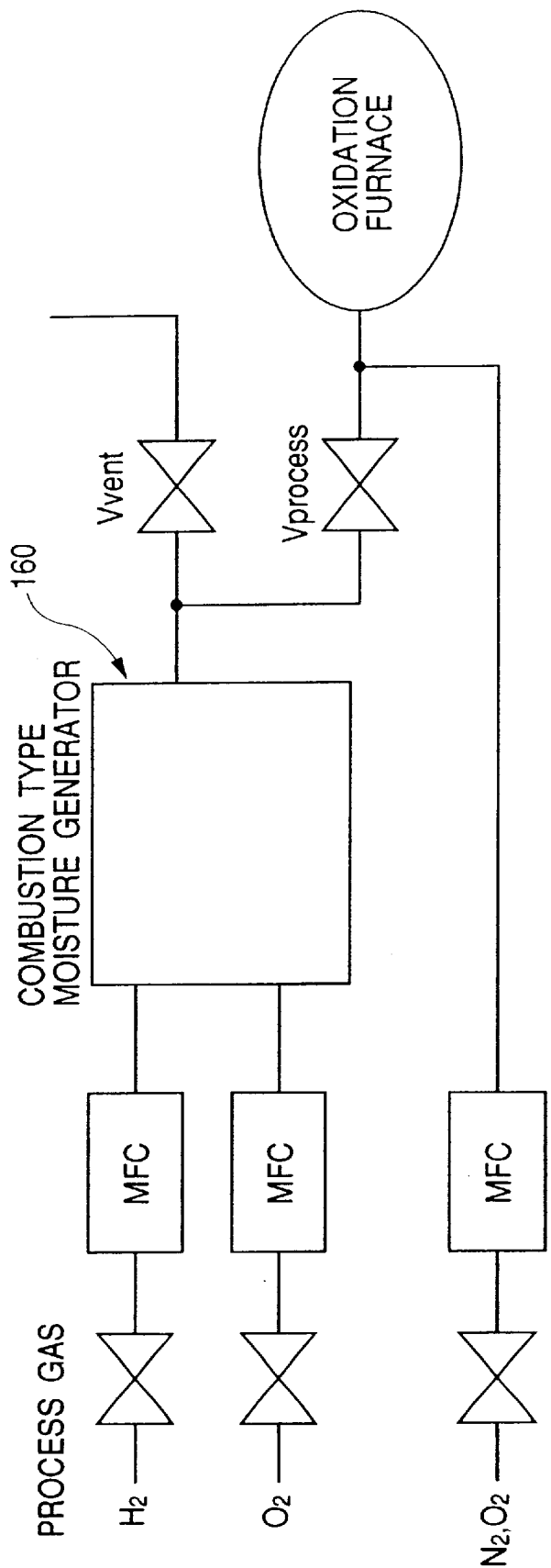

METHOD FOR FABRICATING SEMICONDUCTOR INTEGRATED CIRCUIT DEVICE

This application is a Continuation application of U.S. Ser. No. 09/494,036, filed Jan. 31, 2000, which is a Continuation application of U.S. Ser. No. 09/380,646, filed Sep. 7, 1999, now U.S. Pat. No. 6,239,041, issued May 29, 2001, filed under 35 USC 371 of PCT/JP98/00892, filed Mar. 4, 1998.

TECHNICAL FIELD

This invention relates to a method for fabricating semiconductor integrated circuit devices including semiconductor devices, and more particularly, to a technique useful for application to the formation of gate oxide films (insulating films) such as of MOSFET (metal oxide semiconductor field effect transistor).

BACKGROUND ART

In the initial stage of semiconductor industries, bubbling was in wide use where a carrier gas such as oxygen or the like was passed through water in a bubbler. Although this technique was advantageous in that a wide range of a moisture content could be covered, a problem on pollution could not be avoided, and thus, the technique is rarely used at present. Accordingly, an oxygen and hydrogen combustion method, i.e. a pyrogenic system, has been widespread in order to avoid the disadvantage of the bubbler.
(Disclosure of Prior Art Literature, etc.)

With regard to an improvement in thermal oxidation and a moisture generation method therefor, to which the invention is directed, the following prior art techniques are known.

(1) In Japanese Patent Laid-open No. Hei 6-163517 of Ohmi, there is described a low temperature oxidation technique of lowering temperatures in a semiconductor process. In Example 1 of this application, there is set out a method wherein hydrogen is added to a gas atmosphere comprising about 99% of argon and about 1% of oxygen in an amount of from 100 ppm to 1%, from which steam is obtained at a hydrogen combustion temperature of 700° C. or below, particularly, at 450° C. or below, by the action of a stainless steel catalyst. Moreover, in Example 2 of the application, it is stated to thermally oxidize silicon in an atmosphere consisting of 990% of oxygen and 1% of steam formed by use of a catalyst at normal pressures or under pressure at an oxidation temperature of 600° C.

(2) Japanese Patent Laid-open No. Hei 7-321102 (Yosikoshi) describes high temperature thermal oxidation on silicon surfaces at an oxidation temperature of 850° C. at a very low moisture concentrations i.e. 0.5 ppm of a very super low moisture content region or in a dry region, in order to avoid various problems ascribed to moisture.

(3) In Japanese Patent Laid-open No. Sho 60-107840 of Honma et al, there is described a thermal oxidation method of silicon wherein in order to reduce variations in moisture content caused by moisture in a dry oxidation environment, a very small content of moisture at a level of about several tens of ppm formed according to a conventional method is purposely added.

(4) Japanese Patent Laid-open No. 5-152282 (Ohmi I) discloses a thermal oxidation apparatus which has a hydrogen feed pipe whose inner surfaces are constituted of Ni (nickel) or a Ni-containing material in order to prevent the generation of particles from the tip of a quartz tube as set out hereinabove, and also has means for heating the hydrogen gas feed pipe. In this thermal oxidation apparatus, water is formed by bringing hydrogen into contact with Ni (or the Ni-containing material) inside the hydrogen gas feed pipe heat to 300° C. or over, and reacting the hydrogen activated species with oxygen or (an oxygen-containing gas). More particularly, water is formed according to a catalytic system involving no combustion, so that there is no possibility that the hydrogen feed pipe melts at its tip end to cause particles to be generated.

(5) Japanese Patent Laid-open No. Hei 6-115903 (Ohmi II) discloses a moisture generating method using a catalyst system which comprises the mixed gas-preparing step of mixing oxygen, hydrogen and an inert gas to prepare a first mixed gas, and the moisture-generating step wherein the first mixed gas is introduced into a reactor tube constituted of a material, which has the catalytic action and is capable of conversion of hydrogen and oxygen into radicals and the reactor tube is heated to cause the hydrogen and oxygen present in the first mixed gas to be reacted thereby causing water to be generated.

According to this method, a catalytic material, with which the reaction is able to proceed at lower temperatures, is used as the reaction tube for reaction between hydrogen and oxygen. Eventually, generation of water is enabled at low temperatures. Accordingly, where the mixed gas of hydrogen, oxygen and an inert gas is fed to a heated reaction tube, hydrogen and oxygen undergo complete reaction therebetween in the reaction tube at a temperature of 500° C. or below. Thus, a gas containing moisture can be obtained at temperatures lower than that of a combustion system.

Moreover, if a metal material alone is used for a gas contact portion after exclusion of all plastic materials therefrom and the metal surfaces are subjected passivation treatment, gases (moisture, hydrocarbons and the like) released from the surfaces become very small in amount. This permits more purified moisture to be generated in higher accuracy in a wide range of concentration (covering ppb to %). The passivation treatment is performed by thermally treating a stainless steel, which has been subjected to electrolytic polishing or electrolytic composite polishing, in an acid or weakly acidic atmosphere with an impurity concentration of several ppb or below.

(6) Japanese Patent Laid-open No. Hei 5-141871 (Ohmi III) discloses a thermal treatment apparatus which includes, as least, an opening capable of opening and closing it, through which an article to be treated is carried out and in, a furnace core tube having a gas supply port through which a gas is supplied thereinto, a heating means for heating the inside of the furnace core tube, a gas supply tube connected in communication with the gas supply port, and heating means for heating the gas supply pipe wherein at least inner surfaces of the gas supply pipe is made of Ni (or a Ni-containing material).

This thermal oxidation apparatus is provided with a hydrogen activated species-generating means for forming hydrogen activated species from a hydrogen gas or hydrogen-containing gas without involving generation of a plasma, which is located upstream of a position of an article to be treated which is placed inside the furnace core tube. A hydrogen gas or hydrogen-containing gas is introduced into the hydrogen activated species-generating means to generate activated species of hydrogen. To this end, if a silicon substrate formed with an oxide film thereon is, for example, placed in the furnace core tube as an article to be treated, the activated species of hydrogen diffuse into the oxide film and contributes to termination of dangling bond in the oxide film and at the interface of the oxide film/silicon. Thus, it can be expected to obtain a gate oxide film of high reliability.

(7) In Japanese Patent Laid-open No. Hei 5-144804 of Nakamura et al, there is set forth a technique of thermal treatment of a silicon oxide film with activated species of hydrogen formed by use of a nickel catalyst.

(8) At pages 128 to 133 of the Lecture Papers at the 45th Symposium of the Semiconductor Integrated Circuit Techniques promoted by the Committee of Electronic Materials of the Association of Electrochemistry, there is reported a silicon oxidation process in a strongly reductive atmosphere mainly comprising hydrogen radicals produced by use of a catalyst for application to a tunnel oxide film of flash memories and hydrogen from moisture.

(9) In Japanese Patent Laid-open No. Hei 6-120206 of Ohmi, there is described a sintering technique using hydrogen activated species which are produced by means of a nickel catalyst for an insulating film insulating and isolating a selective epitaxial growth region therewith.

(10) In Japanese Patent Laid-open No. Sho 59-132136 of Kobayashi et al, there is set out a process of oxidizing and reducing silicon and a refractory metal in an oxidative and reductive mixed atmosphere of moisture and hydrogen generated by an ordinary method.

DISCLOSURE OF THE INVENTION (Discussion on Prior Art and the Invention)

In the most recent MOS devices, which are fabricated according to a deep submicron design rule, it is required to form a gate oxide film, which is very thin at 10 nm or below, in order to keep electric characteristics of the finely divided elements. For instance, where a gate length is at 0.35 $\mu$m, a required thickness of the gate oxide film is at approximately 9 nm. If the gate length is at 0.25 $\mu$m, it is assumed that the oxide film thickness becomes so thin as to be at approximately 4 nm.

In general, a thermal oxidation film is formed in a dry oxygen atmosphere. Where a gate oxide film is formed, it has been conventional to use a wet oxidation process (usually at a ratio in partial pressure of moisture of several tens of %) for the reason that the density of defects in the film can be reduced. According to the wet oxidation process, moisture is formed as a result of the combustion of hydrogen in an atmosphere of oxygen, and the moisture is supplied to the surface of a semiconductor wafer (e.g. a wafer for making an integrated circuit or a mere integrated circuit wafer) along with oxygen, thereby forming an oxide film. In view of burning of hydrogen, hydrogen is ignited after oxygen has been sufficiently passed beforehand in order to avoid the danger of explosion. Additionally, the concentration of moisture in a mixed gas of hydrogen+oxygen serving as oxidation species is increased to a level of about 40% (a partial pressure of moisture occupied in a total pressure in the atmosphere).

However, it is indicated that the above combustion system has the problem: since hydrogen is ignited and burnt while being injected from a quartz nozzle attached at the tip of a hydrogen gas supply pipe, the resultant flame comes too near to the nozzle under conditions where the amount of hydrogen is too small; and the nozzle eventually melts by application of heat thereto to cause particles to be generated, which serve as a pollution source of a semiconductor wafer (on the contrary, if the amount of hydrogen is increased in excess, the resultant flame arrives at an end portion of the combustion tube, so that the quartz walls are caused to be melted, thereby generating particles, or the flame is cooled at the wall surfaces and may be put out, thereby presenting a problem on safety). Moreover, in the combustion system, the moisture concentration in the water+oxygen mixed gas serving as oxidation species is so high that hydrogen and a OH group are taken in the gate oxide film. As a result, structural defects such as of an Si—H bond, an Si—OH bond and the like are liable to be produced in the thin film or at the interface with a silicon substrate. These bonds are broken down by application of a voltage stress, such as hot carrier injection, to form a charge trap, thereby causing electric characteristic of the film such as a variation in threshold voltage to be lowered.

It will be noted that the details of these situations and the details in an improved water-forming device using a novel catalyst are described in Japanese Patent Laid-open No. Hei 9-172011 of the present inventors and International Patent Laid-open No. PCT/JP97/00188 (international filing date: Jan. 27, 1997) of the present inventors and Ohimi et al.

According to the studies made by us, known oxidation formation methods are difficult in forming a very thin gate oxide film of a high quality and with a thickness of 5 nm or below (although it is as a matter of fact that similar effects can be expected when the thickness is 5 nm or over) in a uniform thickness and in high fidelity. Needless to say, the formation of a thicker film is also unsatisfactory in many respects.

In order to form a very thin oxide film in a uniform thickness in high fidelity, it is necessary to form a film at an oxide film growing rate lower than that for the formation of a relatively thick oxide film and under more stable oxidation conditions. For instance, in the oxidation film formation method using such a combustion system as set out before, the moisture concentration in a water+oxygen mixed gas serving as oxidation species can be controlled only within a range of concentration as high as from 18% to about 40%. Under these conditions, the oxidation film growth rate is so high that with a thin oxide film, the film can be formed within a very short time. On the other hand, if the oxidation is carried out at a wafer temperature of 800° C. or below in order to lower the film growth rate, the film quality lowers (although the present invention is, of course, applicable to in a temperature range of 800° C. or below by appropriately controlling other parameters).

For the formation of a clean oxide film, it is necessary to remove a low-quality oxide film formed on the surface of a semiconductor wafer by wet cleaning beforehand. However, a thin natural oxide film is inevitably formed on the wafer surface on the way of transferring the wafer from the wet cleaning step to an oxidation step. Moreover, in the oxidation step, an undesirable initial oxide film is formed on the wafer surface by contact with oxygen in the oxidation species prior to intended oxidation. Especially, with the oxide film formation method using a combustion system, hydrogen is burnt after sufficient flow of oxygen in order to avoid the danger of explosion of hydrogen, so that a time of the wafer surface being exposed to oxygen is prolonged, thereby forming a thick initial oxide film (it is accepted that explosive combustion of hydrogen, i.e. "explosion", takes place under conditions of normal pressures, a temperature of 560° C. or over, a hydrogen content of 4% of over, and a sufficient content of oxygen).

In this way, an actual oxide film has an arrangement that includes, aside from an oxide film formed by intended oxidation, a natural oxide film and an initial oxide film. These natural oxide film and initial oxide film are both lower in quality than the intended, intrinsic oxide film. Accordingly, in order to obtain a high-quality oxide film, it is necessary to suppress the ratio of the lower-quality films to the total oxide film to a level as low as possible.

Nevertheless, when a very thin oxide film is formed according to known oxide film formation methods, the ratio of these lower-quality films rather increases.

For example, when a 9 nm thick oxide film is formed using a known oxide film formation method wherein the thicknesses of a natural oxide film and an initial oxide film in the oxide film are assumed to be at 0.7 nm and 0.8 nm, respectively, the thickness of the intrinsic oxide film is at 9−(0.7+0.8)=7.5 nm. The ratio of the intrinsic oxide film in the total oxide film is at about 83.3%. However, when a 4 nm thick oxide film is formed according to the known oxide film formation method, the thicknesses of a natural oxide film and an initial oxide film are not changed at 0.7 nm and 0.8 nm, respectively, the intrinsic oxide film thickness is thus at 4−(0.7+0.8)=2.5 nm, with its ratio being lowered to 62.5%. More particularly, if a very thin film is formed according to the known oxide film formation method, not only uniformity and fidelity of a film thickness are not assured, but also the quality of the film lowers.

In order to solve these problems, we made attention to moisture generation methods of Ohmi et al using catalysts. According to our studies, these methods place emphasis on the strong reduction action of hydrogen radicals on the assumption that "the life of hydrogen radicals is long". Therefore, it will be apparent that these methods cannot be applied to a mass-production process of semiconductor integrated circuits as they are. In other words, for application to a semiconductor process, we have found that necessary parameters have to be studied on the assumption that "the life of hydrogen radicals is very short, and the radicals are generated on a catalyst and are chemically combined or returned to a ground state thereon or in the vicinity of the catalyst".

Further, according to the present inventors, it has been made clear that a ratio of partial pressure of moisture ranging from 0 to 10 ppm belongs to a dry region wherein a nature of so-called dry oxidation appears, which is inferior to so-called wet oxidation with respect to the film quality required for a gate oxide film and the like in a fine process described hereinafter.

Likewise, we have found that a super low moisture region, wherein a partial pressure ratio of moisture ranges from 10 ppm to $1.0 \times 10^3$ ppm (i.e. 0.1%), principally exhibit a nature substantially same as dry oxidation.

Moreover, it has also been found that thermal oxidation in a low moisture region covering a moisture partial pressure ratio in the range of form 0.1% to 10% (especially, in a low moisture region covering a moisture partial pressure ration in the range of 0.5% to 5%) is relatively better in properties than those in other regions (including a dry region, a region ordinarily employed in a combustion system of 10% or over, and a high moisture region having a moisture concentration of several tens of % attained by use of a bubbler or the like). (Objects, etc. of the Invention)

An object of the invention is to provide a technique wherein a high-quality very thin oxide film is formed in a uniform thickness and in high fidelity.

The above and other objects and novel features of the invention will become apparent from the description of the present specification and the accompanied drawings.

SUMMARY OF THE INVENTION

Among the inventions disclosed in this application, typical ones are briefly summarized as follows.

A method for fabricating a semiconductor integrated circuit device of the invention comprises the steps (a) and (b).

(a) the step of generating water from hydrogen and oxygen by the catalytic action, and (b) the step of feeding oxygen containing a low concentration of the water to or in the vicinity of a main surface of a semiconductor wafer heated to a predetermined temperature, under which an oxide film having a thickness of 5 nm or below is formed at an oxide film formation rate sufficient to ensure, at least, fidelity in the formation of an oxide film and uniformity in the oxide film thickness.

In the method for fabricating a semiconductor integrated circuit device of the invention, the oxide film comprises a gate oxide film of MOSFET.

In the method for fabricating a semiconductor integrated circuit device of the invention, the oxide film has a thickness of 3 nm or below.

In the method for fabricating a semiconductor integrated circuit device of the invention, the semiconductor wafer is heated to a temperature of 800° C. to 900° C.

The method for fabricating a semiconductor integrated circuit device of the invention further comprises, after (b) step, subjecting the primary surface of the semiconductor wafer to oxidizing and nitriding treatments to segregate nitrogen at the interface between the oxide film and the substrate.

In the method for fabricating a semiconductor integrated circuit device of the invention, the oxide film is formed by single wafer processing.

In the method for fabricating a semiconductor integrated circuit device of the invention, the oxide film is formed in a batchwise manner.

A method for fabricating a semiconductor integrated circuit device of the invention comprises the following steps (a) and (b).

(a) The step of forming water from hydrogen and oxygen by the catalytic action, and (b) the step of feeding oxygen containing the water in a concentration sufficient to provide an initial breakdown voltage, which is better than that of an oxide film formed in am at least moisture-free, dry oxygen atmosphere to or in the vicinity of a main surface of a semiconductor wafer heated to a predetermined temperature to form an oxide film having a thickness of 5 nm or below.

In the method for fabricating a semiconductor integrated circuit device of the invention, the concentration of the water is 40% or below.

In the method for fabricating a semiconductor integrated circuit device of the invention, the concentration of the water ranges from 0.5 to 5%.

The method for fabricating a semiconductor integrated circuit device of the invention comprises the following steps (a) to (c).

(a) The step of transferring a semiconductor wafer having a first oxide film formed on a primary surface thereof to a cleaning unit wherein the first oxide film is removed by wet cleaning, (b) the step of transferring the semiconductor wafer, without contact with the air, from the cleaning unit to an oxidation unit in an inert gas atmosphere, and (c) the step of feeding oxygen containing a low concentration of water, which is generated from hydrogen and oxygen by the catalytic action, to or in the vicinity of a main surface of the semiconductor wafer heated to a predetermined temperature, under which a second oxide film having a thickness of 5 nm or below is formed at an oxide film formation rate sufficient to ensure, at least, fidelity in the formation of an oxide film and uniformity in the oxide film thickness.

In the method for fabricating a semiconductor integrated circuit device of the invention, the second oxide film includes a natural oxide film, which is undesirably formed on the surface of the semiconductor wafer during the course between the removal of the first oxide film and the formation of the second oxide film, and an initial oxide film undesirably formed on the surface of the semiconductor wafer by contact with the oxygen wherein the total thickness of the natural oxide film and the initial oxide film is not larger than ½ of the whole thickness of the second oxide film.

In the method for fabricating a semiconductor integrated circuit device of the invention, the thickness, in total, of the natural oxide film and the initial oxide film is not larger than ⅓ of the whole thickness of the second oxide film.

A method for fabricating a semiconductor integrated circuit device of the invention comprises the steps of forming a fist oxide film on first and second regions of a semiconductor wafer and removing the first oxide film formed on the first region of the semiconductor wafer, and forming a second oxide film on a first insulating film left in the first region and the second region of the semiconductor wafer wherein at least one of the first and second oxide films is formed according to any one of the methods defined above.

The main features of the invention are described below as numbered.

1. A method for fabricating a semiconductor integrated circuit device, which comprises the steps of:
   (a) preparing moisture from oxygen and hydrogen by use of a catalyst at a temperature of 500° C. or below; and
   (b) forming a silicon oxide film, which serves as a gate insulating film of a field effect transistor, on a surface of silicon by thermal oxidation in an oxidative atmosphere not predominantly comprising hydrogen, in which a ratio of a partial pressure of the prepared moisture to the total atmospheric pressure is in the range of 0.5 to 5%, under conditions where the silicon surface on a wafer is heated to 800° C. or over (as is well known in the art, the term "predominantly" used herein for gas is intended to mean that the intended component in the atmosphere is contained in the largest concentration).

2. A method for fabricating a semiconductor integrated circuit device as recited in 1 above, wherein the oxidative atmosphere contains oxygen gas as its main component.

3. A method for fabricating a semiconductor integrated circuit device as recited in 1 or 2 above, wherein the preparation of the moisture is carried out by acting the catalyst on a mixed gas of oxygen and hydrogen.

4. A method for fabricating a semiconductor integrated circuit device as recited in any one of 1 to 3 above, wherein the thermal oxidation is effected while feeding the oxidative atmosphere to around the wafer.

5. A method for fabricating a semiconductor integrated circuit device, which comprises the steps of:
   (a) preparing moisture from oxygen and hydrogen by use of a catalyst at a temperature of 500° C. or below; and
   (b) forming a silicon oxide film, which serves as a gate insulating film of a field effect transistor, on a surface of silicon by thermal oxidation in an oxidative atmosphere containing oxygen gas, in which a ratio of a partial pressure of the prepared moisture to the total atmospheric pressure is in the range of 0.5 to 5%, under conditions where the silicon surface on a wafer is heated to 800° C. or over.

6. A method for fabricating a semiconductor integrated circuit device as recited in 5 above, wherein the thermal oxidation is performed by use of a hot wall furnace.

7. A method for fabricating a semiconductor integrated circuit device as recited in 5 above, wherein the thermal oxidation is performed by use of a lamp heating furnace.

8. A method for fabricating a semiconductor integrated circuit device as recited in any one of 5 to 7 above, wherein a gas containing the prepared moisture is fed as an oxidative atmosphere after dilution with a gas other than moisture.

9. A method for fabricating a semiconductor integrated circuit device as recited in any one of 5 to 8 above, further comprising the step of
   (c) subjecting the wafer, on which the oxide film has been formed, to surface treatment in an atmosphere containing nitrogen oxide without exposing the wafer to the air or other oxidative atmosphere.

10. A method for fabricating a semiconductor integrated circuit device, which comprises the steps of:
    (a) generating moisture by use of a catalyst at a temperature of 500° C. or below; and
    (b) forming a silicon oxide film, which serves as a gate insulating film of a field effect transistor, on a surface of silicon by thermal oxidation in an oxidative atmosphere containing oxygen gas, in which a ratio of a partial pressure of the prepared moisture to the total atmospheric pressure is in the range of 0.5 to 5%, under conditions where the silicon surface on a wafer is heated to 800° C. or over.

11. A method for fabricating a semiconductor integrated circuit device as recited in 10 above, wherein the oxidative atmosphere contains oxygen gas as its main component.

12. A method for fabricating a semiconductor integrated circuit device as recited in 10 to 11 above, wherein the thermal oxidation is performed while feeding the oxidative atmosphere to around the wafer.

13. A method for fabricating a semiconductor integrated circuit device, which comprises the steps of:
    (a) preparing moisture from oxygen and hydrogen by use of a catalyst at a temperature of 500° C. or below; and
    (b) forming a silicon oxide film, which serves as a gate insulating film of a field effect transistor, on a surface of silicon by thermal oxidation while feeding an oxidative atmosphere containing oxygen gas, in which a ratio of a partial pressure of the prepared moisture to the total atmospheric pressure is in the range of 0.5 to 5%, to around a wafer having the silicon surface heated to 800° C. or over.

14. A method for fabricating a semiconductor integrated circuit device as recited in 13 above, wherein the oxidative atmosphere comprises oxygen gas as its main component.

15. A method for fabricating a semiconductor integrated circuit device as recited in 13 or 14 above, wherein the preparation of the moisture is performed by acting the catalyst on a mixed gas of oxygen and hydrogen.

16. A method for fabricating a semiconductor integrated circuit device, which comprises the steps of:
    (a) preparing moisture from oxygen and hydrogen by use of a catalyst at a temperature of 500° C. or below; and
    (b) forming a silicon oxide film, which serves as a gate insulating film of a field effect transistor, on a surface of silicon by thermal oxidation in an oxidation unit while feeding an oxidative atmosphere containing oxygen gas, in which a ratio of a partial pressure of the prepared moisture to the total atmospheric pressure is in the range of 0.5 to 5%, to around a wafer having the silicon surface heated to 800° C. or over through a narrowed portion provided between a moisture preparation unit and the oxidation unit.

17. A method for fabricating a semiconductor integrated circuit device as recited in 16 above, wherein the oxidative atmosphere contains oxygen gas as its main component.

18. A method for fabricating a semiconductor integrated circuit device as recited in 16 or 17 above, wherein the preparation of the moisture is performed by acting the catalyst on a mixed gas of oxygen and hydrogen.

19. A method for fabricating a semiconductor integrated circuit device, which comprises the steps of:
(a) preparing moisture from oxygen and hydrogen by use of a catalyst;
(b) diluting a first gas containing the thus prepared moisture with a second gas other than moisture;
(c) introducing the diluted first gas into a treating region; and
(d) forming a silicon oxide film, which serves as a gate insulating film of a field effect transistor, on a silicon surface on a wafer in an atmosphere of the thus introduced first gas in the treating region.

20. A method for fabricating a semiconductor integrated circuit device as recited in 19 above, wherein the oxidative atmosphere contains oxygen gas as its main component.

21. A method for fabricating a semiconductor integrated circuit device as recited in 19 or 20 above, wherein the thermal oxidation is performed at a temperature of 800° C. or over.

22. A method for fabricating a semiconductor integrated circuit device as recited in any one of 19 to 21 above, wherein the thermal oxidation is performed while feeding the oxidative atmosphere to around the wafer.

23. A method for fabricating a semiconductor integrated circuit device, which comprises the steps of:
(a) preparing a first gas containing moisture by acting a moisture-preparing catalyst on a mixed gas of oxygen and hydrogen;
(b) diluting the first gas with a second gas other than moisture;
(c) introducing the diluted first gas into a treating region; and
(d) forming a silicon oxide film, which serves as a gate insulating film of a field effect transistor, on a silicon surface on a wafer in an atmosphere of the thus introduced first gas in the treating region.

24. A method for fabricating a semiconductor integrated circuit device as recited in 23 above, wherein the oxidative gas atmosphere contains oxygen gas as its main component.

25. A method for fabricating a semiconductor integrated circuit device as recited in 23 or 24 above, wherein the thermal oxidation is performed at a temperature of 800° C. or over.

26. A method for fabricating a semiconductor integrated circuit device as recited in any one of 23 to 25 above, wherein the thermal oxidation is performed while feeding the oxidative gas atmosphere to around the wafer.

27. A method for fabricating a semiconductor integrated circuit device, which comprises the steps of:
(a) preparing a first gas containing moisture by the action of a catalyst;
(b) diluting the first gas with a second gas other than moisture;
(c) introducing the diluted first gas into a treating region; and
(d) forming a silicon oxide film, which serves as a gate insulating film of a field effect transistor, on a silicon surface on a wafer by thermal oxidation in an atmosphere of the thus introduced first gas in the treating region.

28. A method for fabricating a semiconductor integrated circuit device as recited in 27 above, wherein the oxidative gas atmosphere contains oxygen gas as its main component.

29. A method for fabricating a semiconductor integrated circuit device as recited in 27 or 28 above, wherein the thermal oxidation is performed at a temperature of 800° C. or over.

30. A method for fabricating a semiconductor integrated circuit device as recited in any one of 27 to 29 above, wherein the thermal oxidation is performed while feeding the oxidative gas atmosphere to around the wafer.

31. A method for fabricating a semiconductor integrated circuit device, which comprises the steps of:
(a) preparing a first gas containing moisture by acting a catalyst on a mixed gas of oxygen and hydrogen;
(b) diluting the first gas with a second gas other than moisture;
(c) introducing the diluted first gas into a treating region; and
(d) forming a silicon oxide film, which serves as a gate insulating film of a field effect transistor, on a silicon surface on a wafer by thermal oxidation in an atmosphere of the thus introduced first gas in the treating region.

32. A method for fabricating a semiconductor integrated circuit device as recited in 31 above, wherein the oxidative gas atmosphere contains oxygen gas as its main component.

33. A method for fabricating a semiconductor integrated circuit device as recited in 31 or 32 above, wherein the thermal oxidation is performed at a temperature of 800° C. or over.

34. A method for fabricating a semiconductor integrated circuit device as recited in any one of 31 to 33 above, wherein the thermal oxidation is performed while feeding the oxidative gas atmosphere to around the wafer.

35. A method for fabricating a semiconductor integrated circuit device, which comprises the steps of:
(a) subjecting a silicon surface on a wafer to surface treatment to clean the surface or remove a surface film therefrom;
(b) after the above step, transferring the wafer to an oxidation unit with the wafer being not substantially exposed to an oxidative atmosphere;
(c) preparing moisture from oxygen and hydrogen by use of a catalyst; and
(d) forming a silicon oxide film on the silicon surface by thermal oxidation in an atmosphere containing the prepared moisture.

36. A method for fabricating a semiconductor integrated circuit device as recited in 35 above, wherein the silicon oxide film serves as a gate electrode of an MOS transistor.

37. A method for fabricating a semiconductor integrated circuit device as recited in 36 above, further comprising the step of:
(e) subjecting the wafer having the oxide film formed thereon to surface treatment in an atmosphere containing nitrogen oxide without exposure of the wafer to the air or other oxidative atmosphere.

38. A method for fabricating a semiconductor integrated circuit device as recited in 37 above, further comprising the step of:

(f) forming an electrode material serving as a gate electrode by vapor phase deposition without exposure of the thus surface-treated wafer to the air or other oxidative atmosphere.

39. A method for fabricating a semiconductor integrated circuit device as recited in 36 above, further comprising the step of:
(f) forming an electrode material serving as a gate electrode by vapor phase deposition without exposure of the wafer, on which the oxide film has been formed, to the air or other oxidative atmosphere.

40. A method for fabricating a semiconductor integrated circuit device as recited in any one of 36 to 39 above, wherein the oxidation step is carried out by lamp heating.

41. A method for fabricating a semiconductor integrated circuit device, which comprises the steps of:
(a) subjecting a silicon surface on a wafer to surface treatment to clean the surface or remove a surface film;
(b) after the above step, transferring the wafer to an oxidation unit with the wafer being not substantially exposed the wafer to an oxidative atmosphere;
(c) preparing moisture by use of a catalyst; and
(d) forming a silicon oxide film on the silicon surface by thermal oxidation in an atmosphere containing the prepared moisture.

42. A method for fabricating a semiconductor integrated circuit device as recited in 41 above, wherein the silicon oxide film serves as a gate electrode of an MOS transistor.

43. A method for fabricating a semiconductor integrated circuit device as recited in 42 above, further comprising the step of:
(e) subjecting the wafer having the oxide film formed thereon to surface treatment in an atmosphere containing nitrogen oxide without exposure of the wafer to the air or other oxidative atmosphere.

44. A method for fabricating a semiconductor integrated circuit device as recited in 43 above, further comprising the step of:
(f) forming an electrode material serving as a gate electrode by vapor phase deposition without exposure of the thus surface treated wafer to the air or other oxidative atmosphere.

45. A method for fabricating a semiconductor integrated circuit device as recited in 42 above, further comprising the step of:
(f) forming an electrode material serving as a gate electrode by vapor phase deposition without exposure of the wafer, on which the oxide film has been formed, to the air or other oxidative atmosphere.

46. A method for fabricating a semiconductor integrated circuit device as recited in any one of 41 to 45 above, wherein the oxidation step is performed by lamp heating.

47. A method for fabricating a semiconductor integrated circuit device, which comprises the steps of:
(a) preparing moisture from oxygen and hydrogen by use of a catalyst;
(b) forming a silicon oxide film, which serves as a gate insulating film of a field effect transistor, on a silicon surface on a wafer by thermal oxidation in an atmosphere containing the thus prepared moisture; and
(c) after the above step, subjecting the wafer, on which the silicon oxide film has been formed, to surface treatment in an atmosphere of a gas containing nitrogen oxide without exposing the wafer to the air.

48. A method for fabricating a semiconductor integrated circuit device as recited in 47 above, wherein the silicon oxide film serves as a gate electrode of an MOS transistor.

49. A method for fabricating a semiconductor integrated circuit device as recited in 47 above, further comprising the step of:
(e) subjecting the wafer having the oxide film formed thereon to surface treatment in an atmosphere containing nitrogen oxide without exposure of the wafer to the air or other oxidative atmosphere.

50. A method for fabricating a semiconductor integrated circuit device as recited in 49 above, further comprising the step of:
(f) forming an electrode material serving as a gate electrode by vapor phase deposition without exposure of the thus surface-treated wafer to the air or other oxidative atmosphere.

51. A method for fabricating a semiconductor integrated circuit device as recited in 48 above, further comprising the step of:
(f) forming an electrode material serving as a gate electrode by vapor phase deposition without exposure of the wafer, on which the oxide film has been formed, to the air or other oxidative atmosphere.

52. A method for fabricating a semiconductor integrated circuit device as recited in any one of 47 to 51 above, wherein the oxidation step is performed by lamp heating.

53. A method for fabricating a semiconductor integrated circuit device, which comprises the steps of:
(a) forming an element isolation groove on a silicon surface on a wafer;
(b) forming an insulating film from outside on the element isolation groove;
(c) flattening the silicon surface to expose a portion of the silicon surface on which a thermal oxidation film is to be formed; and
(d) preparing moisture by use of a catalyst and forming a thermal oxidation film serving as a gate insulating film of a field effect transistor on the exposed portion in an atmosphere containing the moisture.

54. A method for fabricating a semiconductor integrated circuit device as recited in 53 above, wherein the flattening is effected according to a chemical mechanical method.

55. A method for fabricating a semiconductor integrated circuit device as recited in 53 or 54 above, wherein the flattening is effected by chemical mechanical polishing.

56. A method for fabricating a semiconductor integrated circuit device as recited in any one of 53 to 55 above, wherein the insulating film from outside is formed by CVD (chemical vapor deposition).

57. A method for fabricating a semiconductor integrated circuit device, which comprises the steps of:
(a) forming element isolation grooves on a silicon surface on a wafer;
(b) forming an insulating film on the element isolation grooves by deposition; and
(c) preparing moisture by use of a catalyst and forming a thermal oxidation film serving as a gate insulating film of a field effect transistor on silicon surfaces surrounded by the element isolation grooves.

58. A method for fabricating a semiconductor integrated circuit device as recited in 57 above, further comprising the step of
(d) flattening the silicon surfaces to expose portions of the silicon surfaces on which a thermal oxidation film is to be formed after the step (b).

59. A method for fabricating a semiconductor integrated circuit device as recited in 57 or 58 above, wherein the flattening is effected by a chemical mechanical method.

60. A method for fabricating a semiconductor integrated circuit device as recited in any one of 57 to 59 above, wherein the flattening is effected by chemical mechanical polishing.

61. A method for fabricating a semiconductor integrated circuit device as recited in any one of 57 to 60 above, wherein the insulating film from outside is formed by CVD (chemical vapor deposition).

62. A method for fabricating a semiconductor integrated circuit device, which comprises the step of heating a silicon surface on a wafer by means of a lamp in an oxidative atmosphere wherein a ratio of partial pressure of moisture to a total atmospheric pressure range from 0.5 to 5%, so that a silicon oxide film, which serves as a gate insulating film of a field effect transistor, is formed on the silicon surface by thermal oxidation.

63. A method for fabricating a semiconductor integrated circuit device as recited in 62 above, wherein the oxidative atmosphere contains oxygen gas as its main component.

64. A method for fabricating a semiconductor integrated circuit device, which comprises the steps of:
   (a) forming a first gas containing moisture by acting a catalyst on a mixed gas of oxygen and hydrogen;
   (b) diluting the first gas with a second gas;
   (c) introducing the thus diluted first gas into a gas treating region; and
   (d) forming a silicon oxide film, which serves as a gate insulating film of a field effect transistor, on a silicon surface on a wafer by thermal oxidation in the introduced first gas atmosphere in the treating region.

65. A method for fabricating a semiconductor integrated circuit device, which comprises the steps of:
   (a) introducing a non-treated wafer into a oxidation unit which is preheated to a level at which moisture is not condensed and which is kept substantially in a non-oxidative atmosphere; and
   (b) forming a silicon oxide film, which serves as a gate insulating film of a field effect transistor, on a silicon surface on the wafer by heating the silicon surface by means of a lamp for thermal oxidation in the oxidation region in an oxidative atmosphere wherein a ratio of partial pressure of moisture to a total atmospheric pressure is in the range of 0.1% of over.

66. A method for fabricating a semiconductor integrated circuit device as recited in 65 above, wherein the non-oxidative atmosphere is mainly comprising nitrogen gas along with a small amount of oxygen gas.

67. A method for fabricating a semiconductor integrated circuit device as recited in 65 or 66 above, wherein the preheating temperature is in the range of from 100° C. to 500° C.

68. A method for fabricating a semiconductor integrated circuit device as recited in any one of 65 to 67 above, wherein the wafer has a surface temperature of 700° C. or over at the time of the oxidation treatment.

69. A method for fabricating a semiconductor integrated circuit device as recited in any one of 65 to 68 above, wherein the non-oxidative atmosphere is preheated to a level at which moisture is not condensed, and subsequently introduced into the oxidation unit.

70. A method for fabricating a semiconductor integrated circuit device as recited in any one of 65 to 69 above, wherein the wafer is preheated to a level at which moisture is not condensed, and subsequently introduced into the oxidation unit.

71. A method for fabricating a semiconductor integrated circuit device, which comprises the step of forming a silicon oxide film, which serves as a gate insulating film of a field effect transition and has a thickness of 5 nm or below, by thermal oxidation in an oxidative atmosphere wherein a ratio of partial pressure of moisture to a total atmospheric pressure range from 0.5 to 5%, under conditions where a silicon surface on a wafer is heated to 800° C. or over.

72. A method for fabricating a semiconductor integrated circuit device as recited in 71 above, wherein the oxidative atmosphere contains oxygen gas as its main component.

73. A method for fabricating a semiconductor integrated circuit device as recited in 71 or 72 above, wherein the thermal oxidation is performed while feeding the oxidative atmosphere to around the wafer.

74. A method for fabricating a semiconductor integrated circuit device, which comprises the step of forming a silicon oxide film, which serves as a tunnel insulating film of a flash memory, by thermal oxidation in an oxidative atmosphere wherein a ratio of partial pressure of moisture to a total atmospheric pressure range from 0.5 to 5%.

75. A method for fabricating a semiconductor integrated circuit device as recited in 74 above, wherein the oxidative atmosphere contains oxygen gas as its main component.

76. A method for fabricating a semiconductor integrated circuit device as recited in 74 or 75 above, wherein the thermal oxidation is performed while feeding the oxidative atmosphere to around the wafer.

77. A method for fabricating a semiconductor integrated circuit device, which comprises the steps of:
   (a) generating moisture by use of a catalyst;
   (b) forming a first thermal oxidation film in a first silicon surface region on a water in a first oxidation unit while feeding an atmospheric gas containing the mixture generated by use of the catalyst to the first oxidation unit;
   (c) generating moisture by combustion of oxygen and hydrogen prior to the step (a) or after the step (b); and
   (d) forming a second thermal oxidation film in a second silicon surface region while feeding an atmospheric gas containing the moisture generated by the combustion to the first or second oxidation unit.

78. A method for fabricating a semiconductor integrated circuit device, which comprises the step of forming a silicon oxide film, which serves as a gate insulating film of an MOS transistor, on a silicon surface on a main surface of a wafer in an oxidative atmosphere wherein a ratio of partial pressure of moisture to a total atmospheric pressure range from 0.5 to 5%, while keeping the main surface of the wafer substantially horizontal.

79. A method for fabricating a semiconductor integrated circuit device, which comprises the steps of:
   (a) preparing moisture, by use of a catalyst, from a mixed gas comprising oxygen in an oxygen-rich amount on comparison with a stoichiometric ratio to water and a non-stoichiometric amount of hydrogen under such temperature conditions that no explosion takes place; and
   (b) forming a silicon oxide film on a silicon surface on a wafer by thermal oxidation in an oxidative atmosphere containing the thus prepared moisture.

80. A method for fabricating a semiconductor integrated circuit device, which comprises the steps of:
   (a) introducing a wafer to be treated into a high-temperature oxidation unit which is heated to 700° C. or over and which is kept in a non-oxidative atmosphere containing a small amount of oxygen sufficient not to substantially cause oxidation to proceed;

(b) preparing moisture from oxygen and hydrogen by use of a catalyst at 500° C. or below; and (c) forming a silicon oxide film, which serves as a gate insulating film of a field effect transistor, on a silicon surface on the wafer by thermal oxidation in the oxidation unit in an oxidative atmosphere wherein a ratio of partial pressure of moisture to a total atmospheric pressure range from 0.5 to 5% under conditions where a silicon surface on the wafer is heated to 700° C. or over.

(Other Features, etc. of the Invention)

The above and other features of the invention are summarized below as itemized.

A. A method for fabricating a semiconductor integrated circuit device, characterized by comprising the following steps (a) and (b):
  (a) forming water from hydrogen and oxygen by the catalytic action; and
  (b) forming an oxide film having a thickness of 5 nm or below on a main surface of a semiconductor wafer at an oxide film growth rate sufficient to ensure, at least, fidelity in the formation of the oxide film and uniformity of the oxide film thickness while feeding oxygen containing the water at a low concentration to the semiconductor wafer heated to a predetermined temperature.

B. A method for fabricating a semiconductor integrated circuit device as recited in A above, characterized in that the oxide film serves as a gate oxide film of MOSFET.

C. A method for fabricating a semiconductor integrated circuit device as recited in A above, characterized in that the oxide film has a thickness of 3 nm or below.

D. A method for fabricating a semiconductor integrated circuit device as recited in A above, characterized in that the heating temperature of the semiconductor wafer is from 800 to 900° C.

E. A method for fabricating a semiconductor integrated circuit device as recited in A above, characterized in that after the (b) step, the semiconductor wafer is subjected to oxidizing and nitriding treatment on the main surface thereof to cause nitrogen to be segregated at the interface between the oxide film and a substrate.

F. A method for fabricating a semiconductor integrated circuit device as recited in A above, characterized in that the oxide film is formed by single wafer processing.

G. A method for fabricating a semiconductor integrated circuit device as recited in A above, characterized in that the oxide film is formed in a batchwise manner.

H. A method for fabricating a semiconductor integrated circuit device, characterized by comprising the steps (a) and (b):
  (a) forming water from hydrogen and oxygen by the catalytic action; and
  (b) forming an oxide film having a thickness of 5 nm or below on a main surface of a semiconductor wafer by feeding oxygen, which contains the water at a concentration sufficient to provide an initial breakdown voltage better than that of an oxide film formed in an at least water-free, dry oxygen atmosphere, to the main surface of the semiconductor wafer heated to a predetermined temperature.

I. A method for fabricating a semiconductor integrated circuit device as recited in H above, characterized in that the concentration of the water is 40% or below.

J. A method for fabricating a semiconductor integrated circuit device as recited in H above, characterized in that the concentration of the water ranges from 0.5 to 5%.

K. A method for fabricating a semiconductor integrated circuit device as recited in H above, characterized in that the oxide film has a thickness of 3 nm or below.

L. A method for fabricating a semiconductor integrated circuit device comprising the steps of (a) to (c):
  (a) transferring a semiconductor wafer, which has a first oxide film formed on a main surface thereof, to a cleaning unit wherein the first oxide film is removed by wet cleaning;
  (b) transferring the semiconductor wafer from the cleaning unit to an oxidation unit in an inert gas atmosphere without contact of the semiconductor wafer with the air; and
  (c) feeding oxygen, which contains a low concentration of water generated from hydrogen and oxygen by the catalytic action, to or in the vicinity of a main surface of the semiconductor wafer heated to a predetermined temperature to form a second oxide film having a thickness of 5 nm or below on the main surface of the semiconductor wafer at a oxide film growth rate sufficient to ensure, at least, fidelity in the formation of an oxide film and uniformity in thickness of the oxide film.

M. A method for fabricating a semiconductor integrated circuit device as recited in L above, characterized in that the oxide film has a thickness of 3 mm or below.

N. A method for fabricating a semiconductor integrated circuit device as recited in H above, characterized in that the second oxide film includes, as part thereof, a natural oxide film undesirably formed on the surface of the semiconductor wafer and an initial oxide film undesirably formed on the surface of the semiconductor wafer through contact with the oxygen during the course of the removal of the first oxide film to the formation of the second oxide film wherein the total thickness of the natural oxide film and the initial oxide film is not larger than ½ of the whole thickness of the second oxide film.

O. A method for fabricating a semiconductor integrated circuit device as recited in L above, characterized in that the total thickness of the natural oxide film and the initial oxide film is not larger than ⅓ of the whole thickness of the second oxide film.

P. A method for fabricating a semiconductor integrated circuit device, characterized by comprising the steps of forming a first oxide film on first and second regions of a semiconductor wafer and removing the first oxide film from the first region of the semiconductor wafer, and further forming a second oxide film on the first region of the semiconductor wafer and also on the first insulating film left on the second region wherein at least one of the first and second oxide films is formed by a method comprising the steps (a) and (b) recited in 1 hereinbefore.

BRIEF DESCRIPTION OF THE DRAWINGS

FIG. 11(a) is a schematic plan view showing an example of an arrangement of an oxide film forming chamber, and (b) is a sectional view taken along line B–B' of (a).

FIG. 12(a) is a schematic plan view showing other example an arrangement of an oxide film forming chamber, and (b) is a sectional view taken along line B–B' of (a).

FIG. 33 is a schematic view showing a further embodiment of a method for forming an oxide film according to the invention.

BEST MODE FOR CARRYING OUT THE INVENTION

Figure 1:
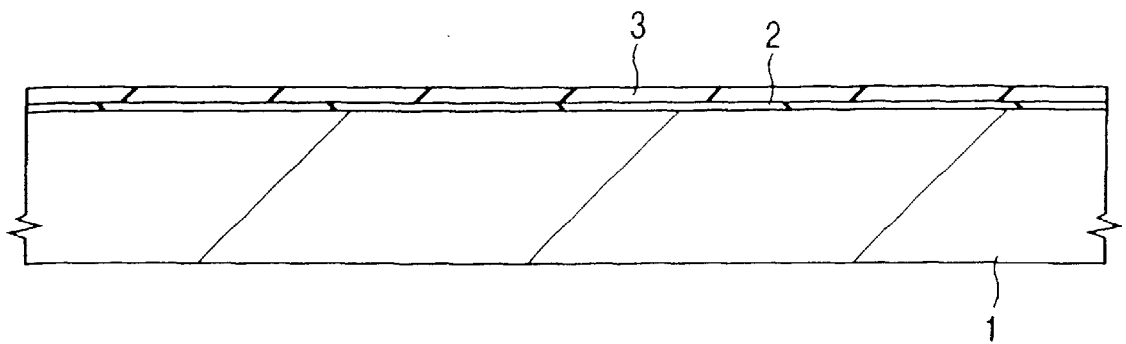
FIG. 1 is a sectional view of an essential part illustrating a method for fabricating a semiconductor integrated circuit device according to embodiment 1 of the invention.

The embodiments of the invention are described in details based on the accompanying drawings. Throughout the drawings for illustrating the embodiments of the invention, like reference numerals indicate like members having a like function and are not repeatedly illustrated.

For convenience's sake, the invention is described by division into several examples or items, but it is a matter of fact that these embodiments or items are not independent, but have interrelations with each other to constitute modifications of other embodiments, details of a specific step or process, or devices used in some steps. More particularly, if individual apparatus or unit processes illustrated in one embodiment may be applicable to other embodiments as they are, these apparatus or unit processes are not repeatedly described in other embodiments. On the contrary, where individual apparatus or unit processes, which are independently illustrated, may be applied to other embodiments as they are, these are not repeatedly illustrated in other embodiments.

(Semiconductor Process A)

The method for fabricating a CMOSFET (complementary metal oxide semiconductor field effect transistor) according to this embodiment is described with reference to FIGS. 1 to 26 (mainly FIGS. 1 to 8 10, 16, and 22 to 26).

Figure 2:
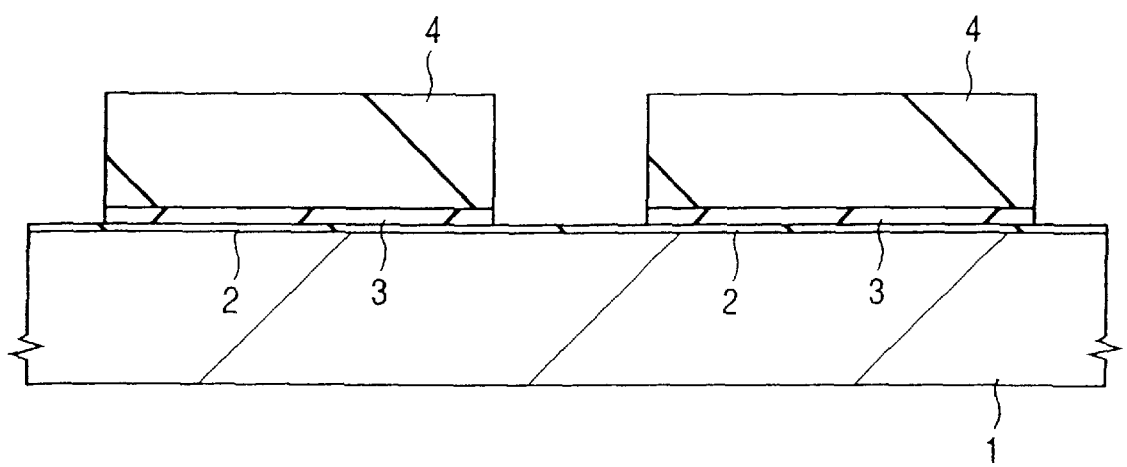
FIG. 2 is a sectional view of an essential part illustrating a method for fabricating a semiconductor integrated circuit device according to embodiment 1 of the invention.

As shown in FIG. 1, a semiconductor substrate 1 made of single crystal silicon whose specific resistance is at about 10 Ωcm is thermally treated to form a silicon oxide film 2 having a thickness of approximately 10 nm on a main surface thereof (thermal oxidation process A1), followed by deposition of an about 100 nm thick silicon nitride film 3 on the silicon oxide film 2 by a CVD method. Thereafter, as shown in FIG. 2, a photoresist 4 is formed on the silicon nitride film 3 so that an element isolation region is allowed to be opened, followed by patterning of the silicon nitride film 3 through a mask of the photoresist 4.

Figure 3:
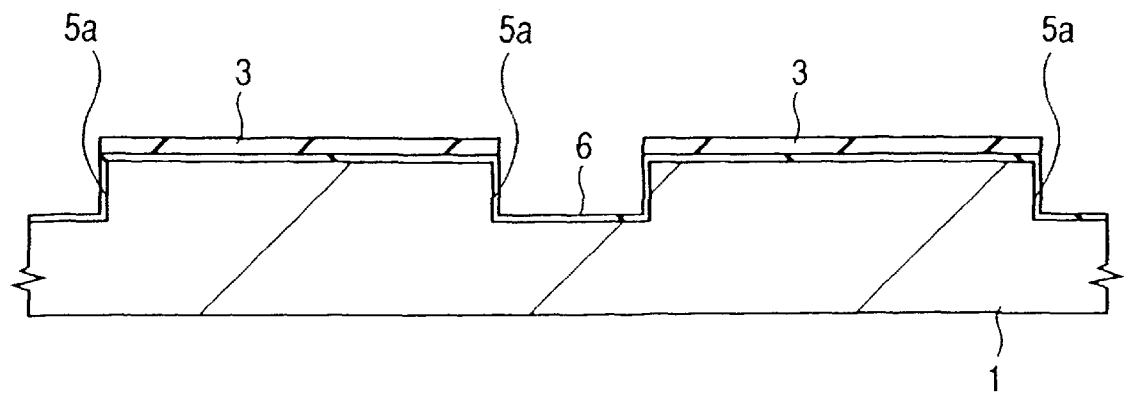
FIG. 3 is a sectional view of an essential part illustrating a method for fabricating a semiconductor integrated circuit device according to embodiment 1 of the invention.
Figure 4:
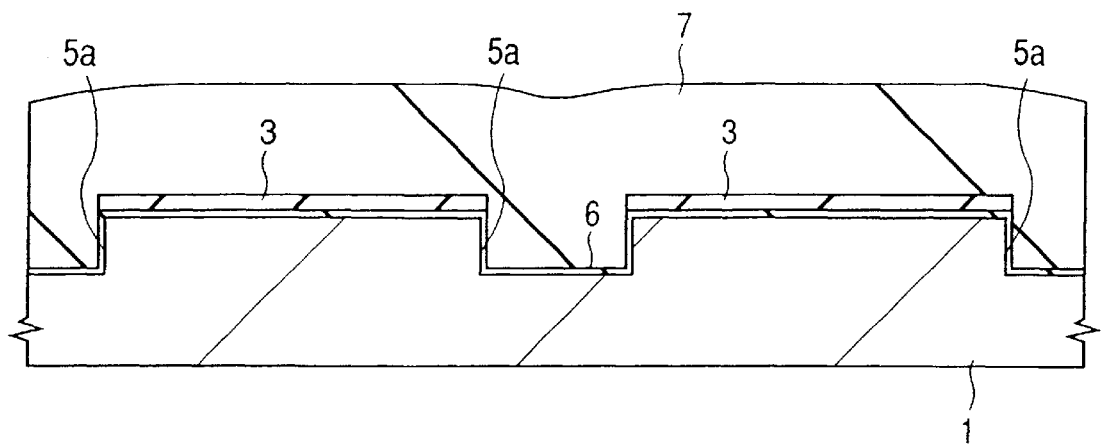
FIG. 4 is a sectional view of an essential part illustrating a method for fabricating a semiconductor integrated circuit device according to embodiment 1 of the invention.

Next, after removal of the photoresist 4, as shown in FIG. 3, the silicon oxide film 2 and the semiconductor substrate 1 are successively etched through a mast of the silicon nitride film 3 to form an about 350 nm deep groove 5a in the semiconductor substrate 1, and thermally oxidized at a temperature of 900 to 1150° C. to form a silicon oxide film 6 on the inner walls of the groove 5a (thermal oxidation process A2).

Figure 5:
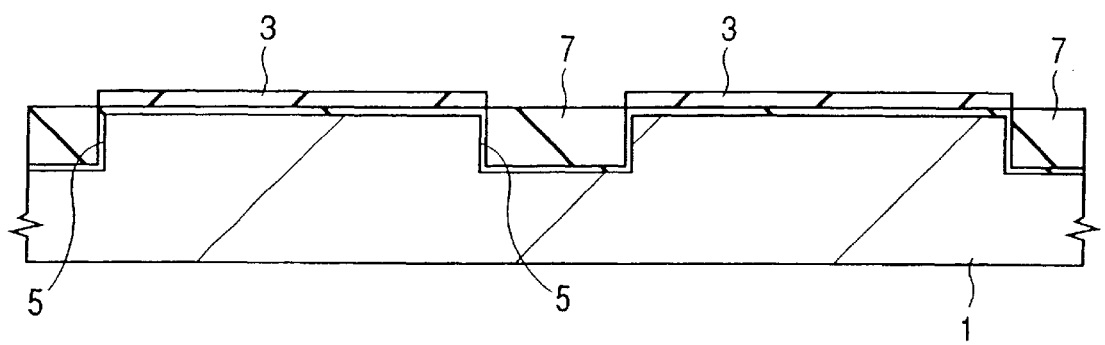
FIG. 5 is a sectional view of an essential part illustrating a method for fabricating a semiconductor integrated circuit device according to embodiment 1 of the invention.

As shown in FIG. 3, a silicon oxide film 7 having a thickness of about 800 nm is deposited on the semiconductor substrate 1 according to a CVD method using, for example, ozone ($O_3$) and tetraethoxysilane (($C_2H_5O)_4Si$) as a source gas. Thereafter, as shown in FIG. 5, the silicon oxide film 7 is polished by chemical mechanical polishing (CMP) in such a way that the silicon oxide film 7 is left only at the inside of the groove 5a by use of the silicon nitride film 3 as a polishing stopper, thereby forming an element isolation groove 5, followed by thermal treatment at about 1000° C. to densify the silicon oxide film 7 inside the element isolation groove 5.

Figure 6:
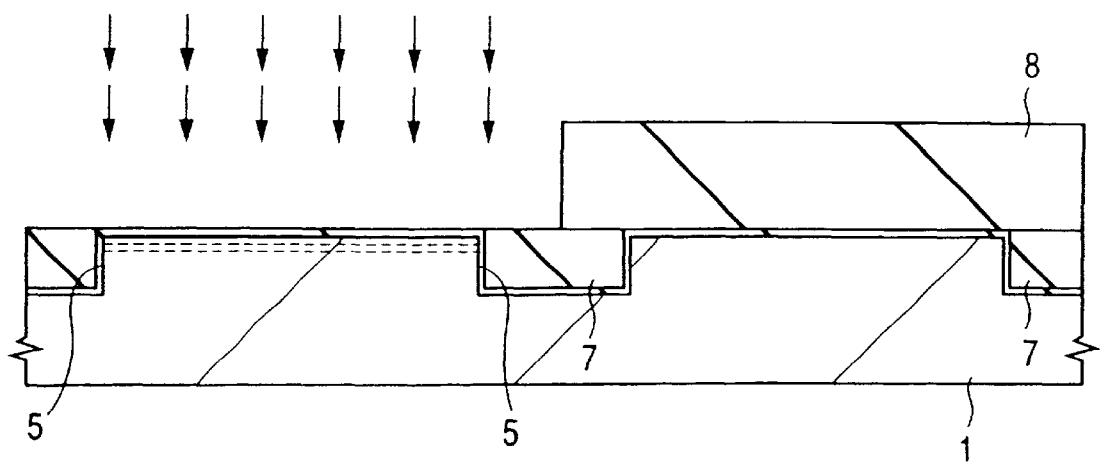
FIG. 6 is a sectional view of an essential part illustrating a method for fabricating a semiconductor integrated circuit device according to embodiment 1 of the invention.

Next, the silicon nitride film 3 is removed by wet etching with hot phosphoric acid, after which, as shown in FIG. 6, an impurity for forming an n-type well is ion-implanted into the semiconductor substrate 1 through the mask of the photoresist 8 having an opening at a p channel-type MOSFET-forming region (left side as viewed in the figure). Further, an impurity for controlling a threshold voltage of the p channel-type MOSFET is ion-implanted. An impurity for forming an n-type well is ion-implanted by using, for example, P (phosphorus) under conditions of energy=360 keV and dose=$1.5 \times 10^{12}/cm^2$.

Figure 7:
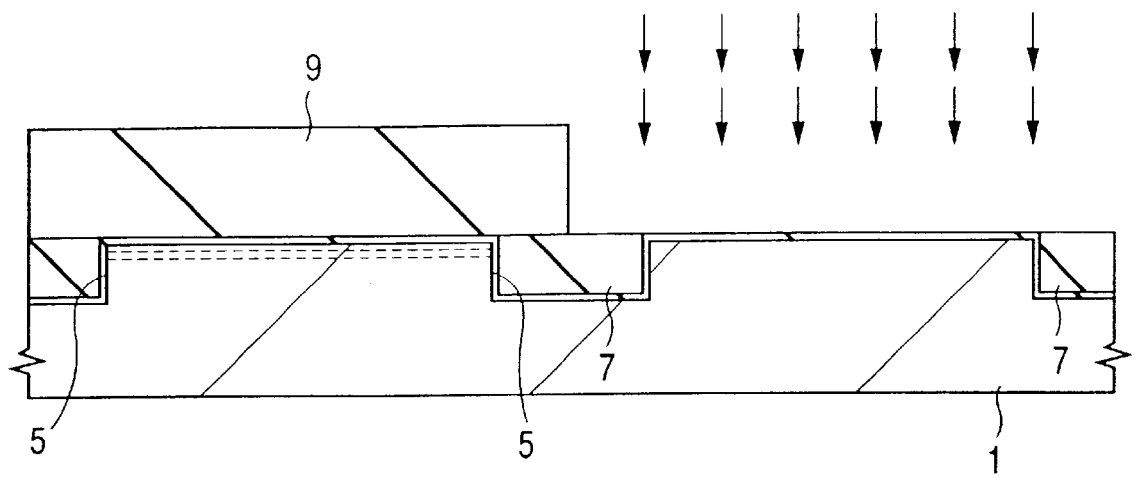
FIG. 7 is a sectional view of an essential part illustrating a method for fabricating a semiconductor integrated circuit device according to embodiment 1 of the invention.

After removal of the photoresist 8, as shown in FIG. 7, an impurity for forming a p-type well is ion-implanted into the semiconductor substrate 1 through the mask of a photoresist 9 having an opening at an n channel-type MOSFET-forming region (right side as viewed in the figure). Moreover, an impurity for controlling the threshold voltage of the n channel-type MOSFET is ion-implanted. B (boron) is used, for example, as the impurity for the formation of a p-type well and is ion-implanted under conditions of energy=200 keV and dose=$1.0 \times 10^{13}/cm^2$. Moreover, boron fluoride ($BF_2$) is used, for example, as the impurity for controlling a threshold voltage and is ion-implanted under conditions of energy=40 keV and dose=$2 \times 10^{12}/cm^2$.

Figure 8:
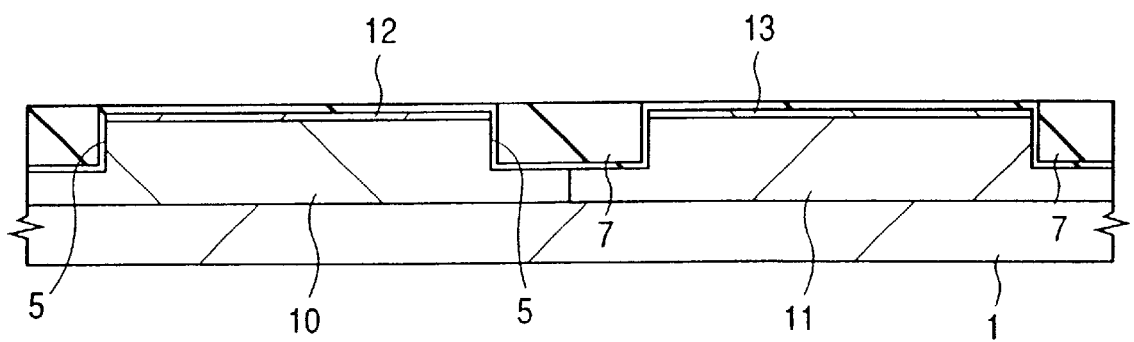
FIG. 8 is a sectional view of an essential part illustrating a method for fabricating a semiconductor integrated circuit device according to embodiment 1 of the invention.

Next, after removal of the photoresist 9, as shown in FIG. 8, the semiconductor substrate 1 is thermally treated at 950° C. for approximately 1 minute to cause the n-type impurity and p-type impurity to be drawn and diffused, thereby forming an n-type well 10 in the semiconductor substrate 1 of the p channel-type MOSFET-forming region and a p-type channel region 12 in the vicinity of the surface thereof. Simultaneously, a p-type well is formed in the semiconductor substrate 1 of the n channel-type MOSFET-forming region along with an n channel-type region 13 in the vicinity of the surface thereof.

Next, a gate oxide film is, respectively, formed on the surfaces of the n-type well 10 and the p-type well 11 according to the following procedure (thermal oxidation process A3).

Figure 9:
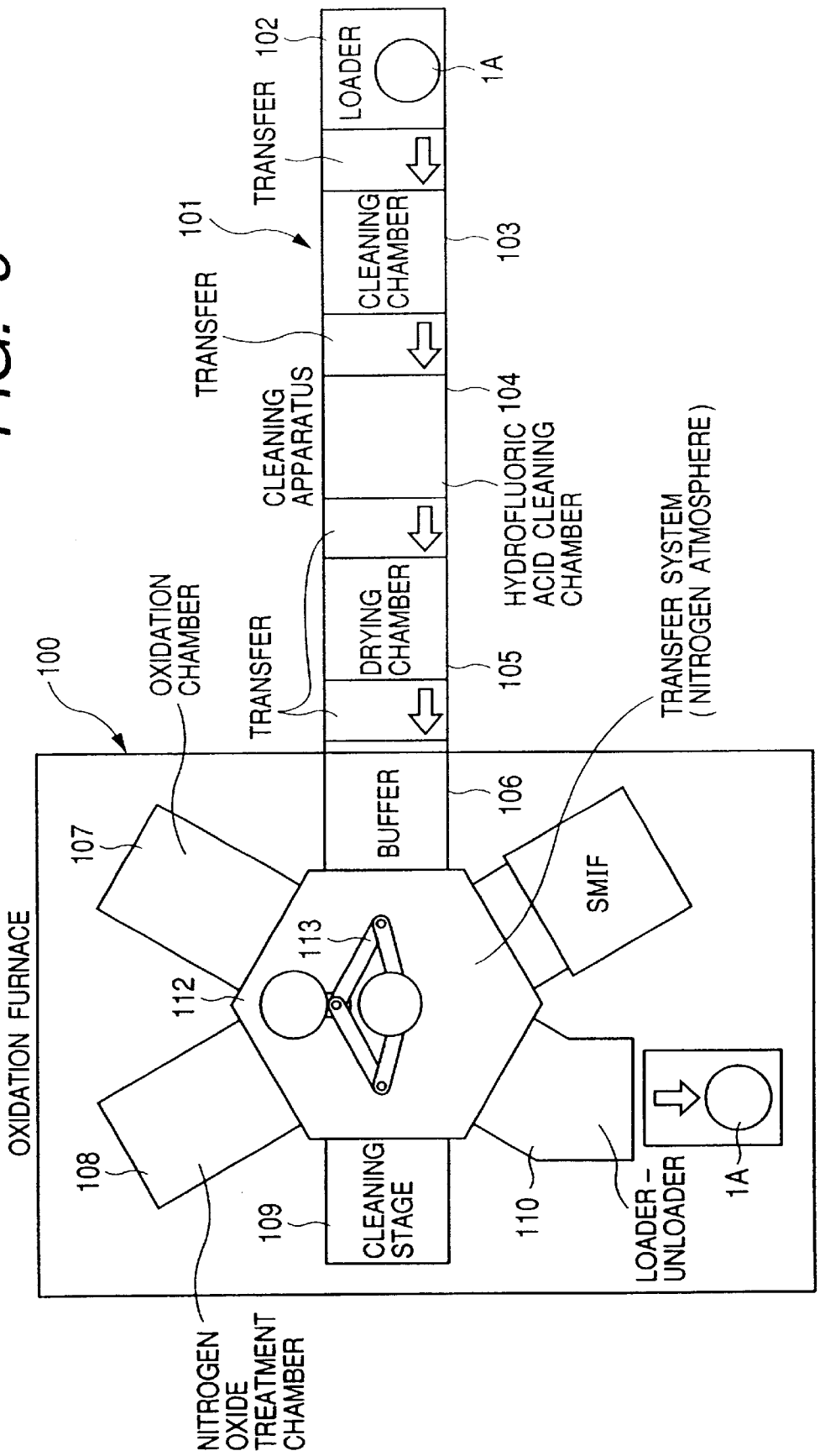
FIG. 9 is a schematic view showing an oxide film forming apparatus of the single wafer type used to form a gate oxide film.

FIG. 9 is a schematic view showing a single wafer-type oxide film-forming apparatus used to form a gate oxide film. As shown, an oxide film-forming apparatus 100 is connected downstream of a cleaning device 101 for removing an oxide film on the surface of a semiconductor wafer 1A by a wet cleaning system prior to the formation of a gate oxide film. When adopting such a cleaning-oxidizing through treatment system, the semiconductor wafer 1A, which has been subjected to cleaning treatment within the cleaning device, can be transferred to an oxide film-forming apparatus 100 within a short time without contact of the semiconductor wafer 1A with the air. Thus, the semiconductor wafer 1A is prevented from being formed with a natural oxide film on the surface thereof to an extent as low as possible during the course of from the removal of the oxide film till the formation of a gate oxide film.

Figure 10:
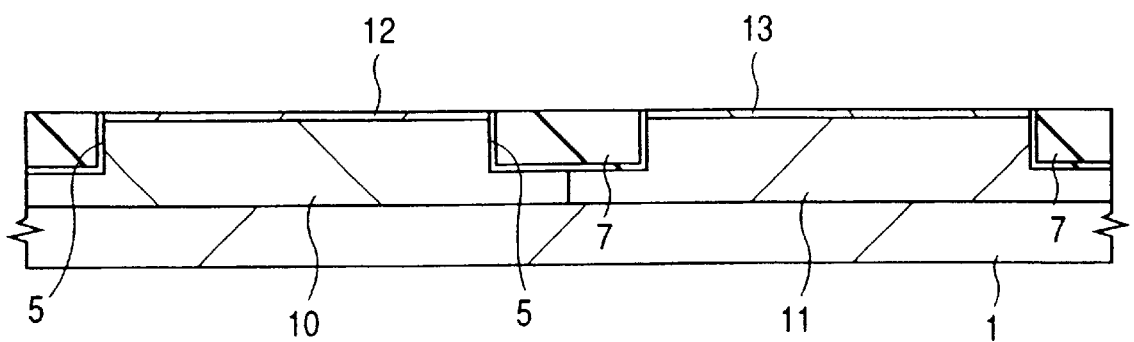
FIG. 10 is a sectional view of an essential part illustrating a method for fabricating a semiconductor integrated circuit device according to embodiment 1 of the invention.

The semiconductor wafer 1A loaded in a loader 102 of the cleaning device 101 is initially transferred to a cleaning chamber 103 wherein it is subjected to cleaning treatment with a cleaning solution made, for example, of $NH_4OH+$ $H_2O_2+H_2O$, followed by further transfer to a hydrofluoric acid cleaning chamber 104 where the wafer is subjected to cleaning treatment with diluted hydrofluoric acid ($HF+H_2O$) to remove the silicon oxide film from the surface thereof (FIG. 10). Thereafter, the semiconductor wafer 1A is transferred to a drying chamber 105 and dried to remove the moisture from the surface thereof. The moisture left on the surface of the semiconductor wafer 1A has to be removed to an satisfactory extent because it causes structural defects, such as of Si—H, Si—OH and the like, in the gate oxide film and at the interface between the gate oxide film/silicon.

The semiconductor wafer 1A obtained after completion of the drying treatment is transferred immediately to the oxide film-forming apparatus through a buffer 106.

The oxide film-forming apparatus 100 is constituted of a multi-chamber system including, for example, an oxide film-forming unit 107, an oxide nitride film-forming chamber 108, a cleaning stage 109, a loader/unloader 110, and the like. A transfer system 112 located at the center of the apparatus is provided with a robotic hands 113 for transfer to (from) the above respective chambers. The inside of the transfer system 112 is kept in an atmosphere of an inert gas such as nitrogen in order to suppress a natural oxide film from forming on the surface of the semiconductor to a level as low as possible by incorporation of the air. The inside of the transfer system 112 is also kept in a super low moisture atmosphere at a level of ppb because the deposition of moisture on the surface of the semiconductor wafer 1A is suppressed to as low as possible. The semiconductor wafer 1A transferred to the oxide film-forming apparatus 100 is transferred, one by one or two by two, to the oxide film-forming unit 107 through the robotic hands 113.

FIG. 11(a) is a schematic plan view showing an example of a particularly arrangement of the oxide film-forming unit 107, and FIG. 11(b) is a sectional view, taken along line B–B' of FIG. 11(a).

This oxide film-forming unit 107 is provided with a chamber 120 constituted of a-multiple-wall quartz tube, and has heaters 121a, 121b for heating the semiconductor wafer 1A at upper and lower portions thereof. The chamber 120 accommodates therein a disk-shaped soaking ring 122 for uniformly dispersing heat supplied from the heaters 121a, 121b over the whole surface of the semiconductor wafer 1A, and has a susceptor 123 for horizontally keeping the semiconductor wafer 1A at the upper portion thereof. The soaking ring 122 is made of a heat-resistant material such as quartz, SiC (silicon carbide) or the like, and is supported by means of a support arm extending from the wall face of the chamber 120. A thermocouple 125 for measuring a temperature of the semiconductor substrate 1A, which is held with the susceptor 123, is disposed in the vicinity of the soaking ring 122. The heating of the semiconductor wafer 1A may be performed by use of, aside from a heating system including the heaters 121a, 121b, a heating system including, for example, a lamp 130 as shown in FIG. 12.

A gas introduction pipe 126 for introduction water, oxygen and a purge gas into the chamber 120 is connected an one end thereof with part of the wall surfaces of the chamber 120. The gas introduction pipe 126 is connected at the other end with a moisture generator of a catalyst type described hereinafter. A partition wall 128 having a multitude of through-holes 127 is provided in the vicinity of the gas introduction pipe. The gas introduced into the chamber 120 is uniformly passed throughout the chamber 120 via the through-holes 127 of the partition wall 128. The chamber 120 has other part of the wall surface, which is connected with one end of an exhaust pipe 129 for discharging the gas introduced into the chamber 120.

Figure 13:
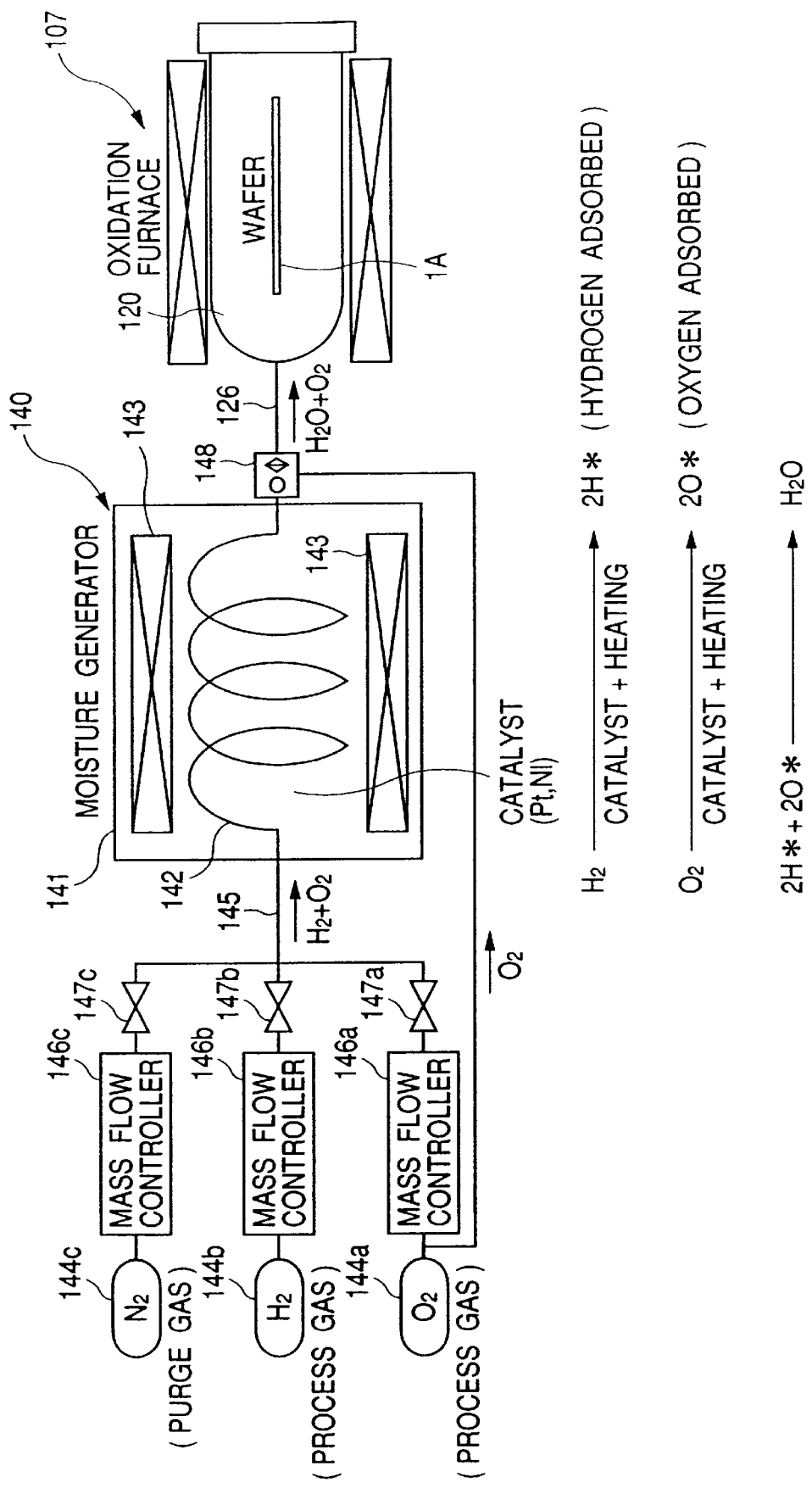
FIG. 13 is a schematic view showing a moisture generator of a catalyst type connected to an oxide film forming chamber.
Figure 14:
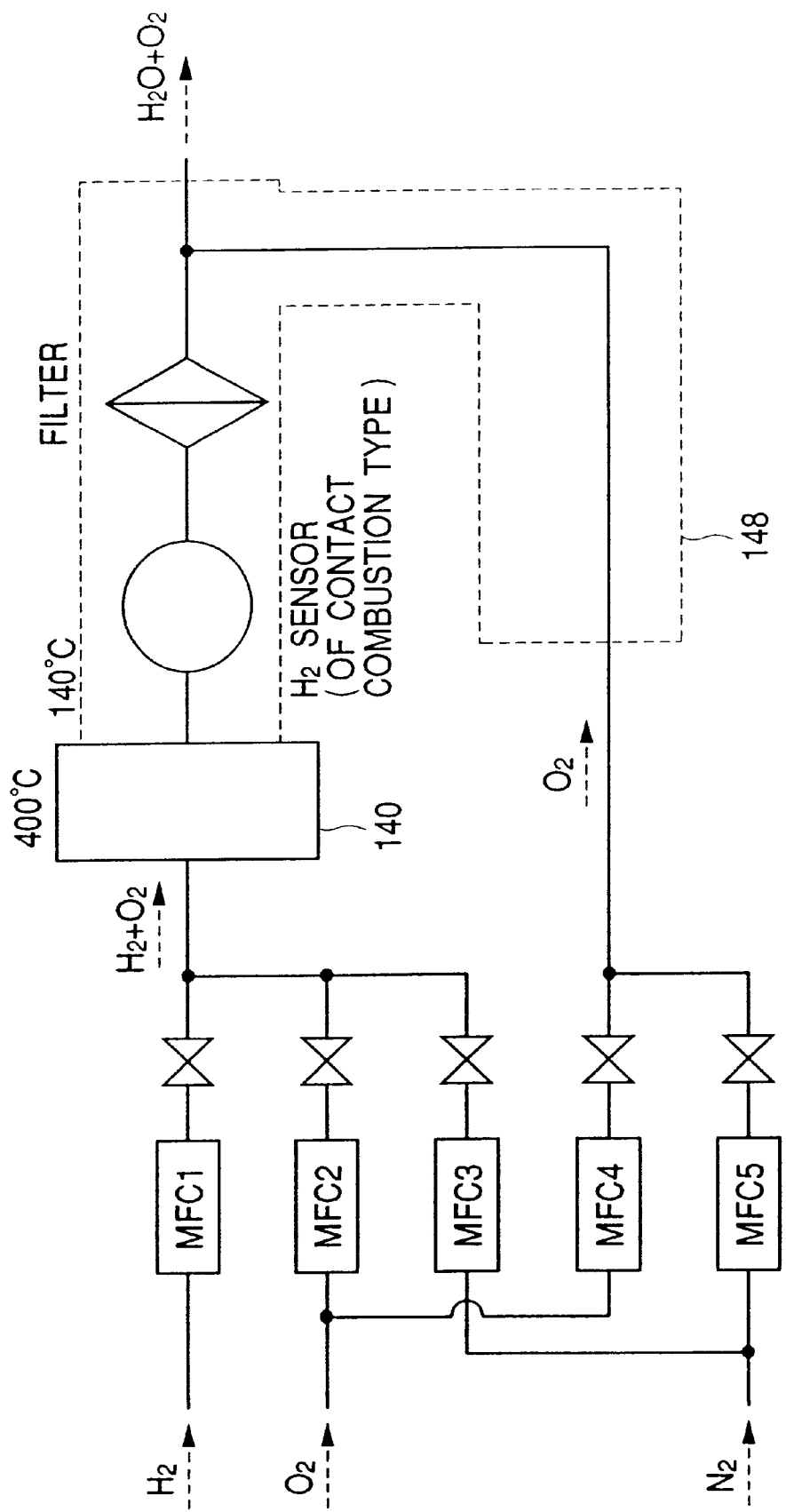
FIG. 14 is a schematic enlarged view of a part of FIG. 13.

FIGS. 13 and 14 are, respectively, a schematic view showing a moisture generator of a catalyst type connected to the chamber 120. The moisture generator 140 is provided with a rector 141 made of a heat and corrosion-resistant alloy (i.e. an Ni alloy known, for example, as "Hastelloy"), in which a coil 142 made of a catalytic metal such as Pt (platinum), Ni (nickel), Pd (palladium) or the like, and a heater 143 for heating the coil 142 are accommodated.

A process gas comprising hydrogen and oxygen and a purge gas including an inert gas such as nitrogen, Ar (argon) or the like is introduced into the reactor from gas reservoirs 144a, 144b and 144c through a pipe 145. There are provided, on the way of the pipe 145, mass flow controllers 146a, 146b, 146c for controlling an amount of a gas and also on-off valves 147a, 147b, 147c for turning gas flow paths on or off, respectively. Thus, amounts of gases and ratios of components introduced into the reaction can be accurately controlled.

The process gas (hydrogen and oxygen) introduced into the reactor 141 is contacted with the coil 142, heated to about 350 to 450° C., and excited, so that hydrogen radicals are generated from hydrogen molecules ($H_2 \rightarrow 2H^+$) and oxygen radicals are generated from oxygen molecules ($O_2 \rightarrow 2O^-$). Since these two kinds of radicals are chemically very active, rapid reaction proceeds to generate water ($2H^+ O^- \rightarrow H_2O$). This water is mixed with oxygen at a connection portion 148 and thus diluted at a low concentration, followed by charge into the chamber 120 of the oxide film-forming chamber through the gas introduction pipe 126.

Such a catalyst-type moisture generator 140 is able to control amounts of hydrogen and oxygen, which take part in the formation of water, in high accuracy, so that the concentration of water introduced into the chamber 120 of the oxide film-forming unit 107 along with oxygen can be precisely controlled within a wide range of from a super low concentration on the order of ppt or below to a high concentration of about several tens of percent. When a process gas is introduced into the reactor 141 whereupon water is instantaneously generated to obtain a desired moisture concentration in real time. Accordingly, hydrogen and oxygen can be simultaneously introduced into the reactor 141, and it is not necessary to introduce oxygen prior to hydrogen as in a conventional moisture generating system using a combustion system. It will be noted that a catalytic metal in the reactor 141 may be replaced by any materials other than such metals as mentioned before provided that they are able to radicalize hydrogen and oxygen. Aside from the use of a catalytic metal process in the form of a coil, it may be processed, for example, into a hollow tube or fine fibrous filter, through which a process gas is passed.

Figure 15:
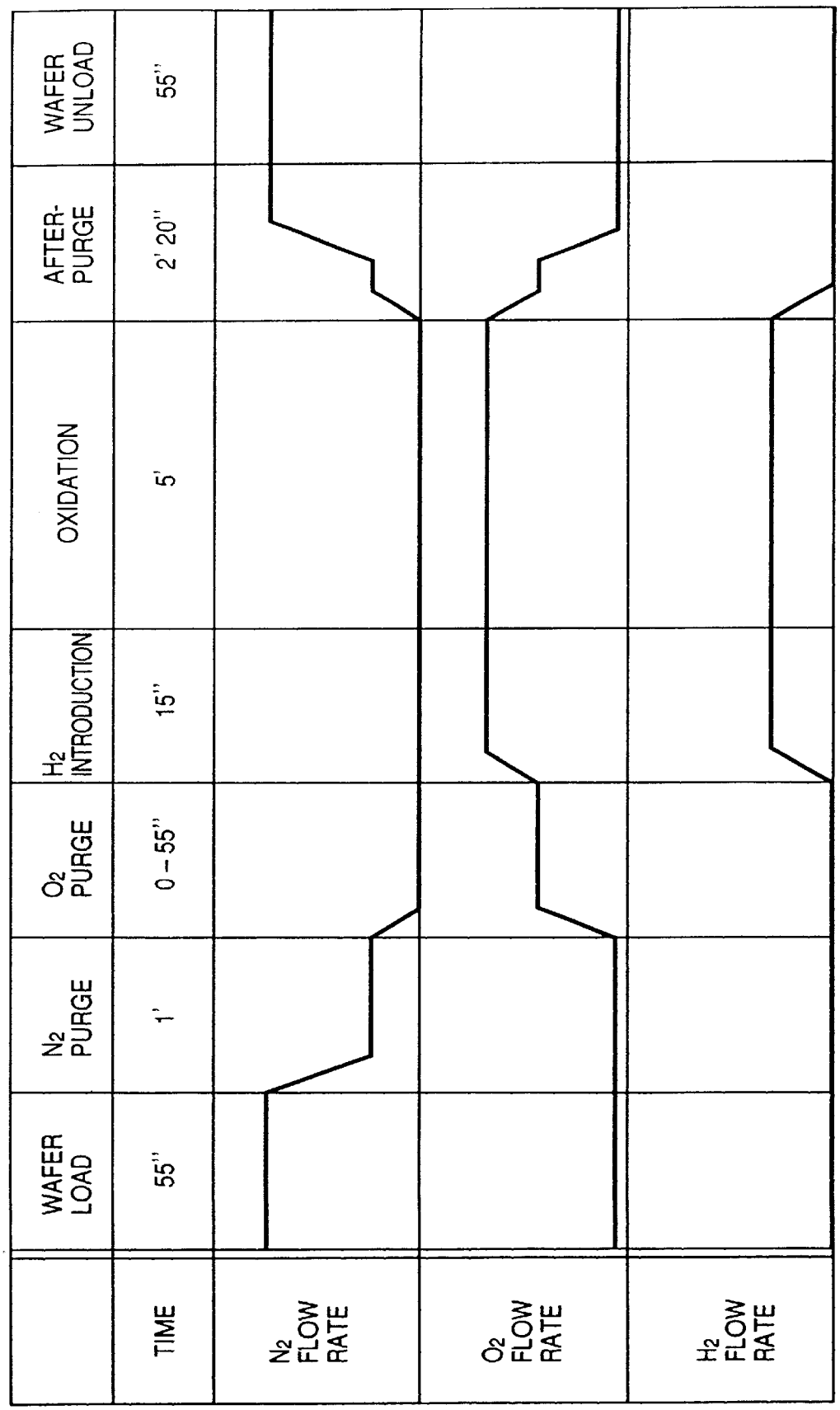
FIG. 15 is an illustrating view showing an example of a sequence of the formation of a gate oxide film.

An example of a sequence of the formation of a gate oxide film using the oxide film-forming apparatus 100 is described with reference to FIG. 15.

Initially, the chamber 120 of the oxide film-forming unit 107 is opened, after which while introducing a purge gas thereinto, the semiconductor wafer 1A is loaded on the susceptor 123. The time required from the transfer of the semiconductor wafer 1A to the chamber 120 till its loading on the susceptor 123 takes 55 seconds. Thereafter, the chamber is closed, followed by further introduction of a purge gas for 30 minutes to permit satisfactory gas exchange in the chamber 120. The susceptor 123 is heated beforehand by means of the heaters 121a, 121b so that the semiconductor wafer is quickly heated. The heating temperature of the semiconductor wafer 1A ranges from 800 to 900° C. and is, for example, at 850° C. If the wafer temperature is 800° C. or below, the resultant gate oxide film lowers in quality. On the other hand, if the temperature is 900° C. or over, the wafer is liable to suffer surface roughening.

Figure 16:
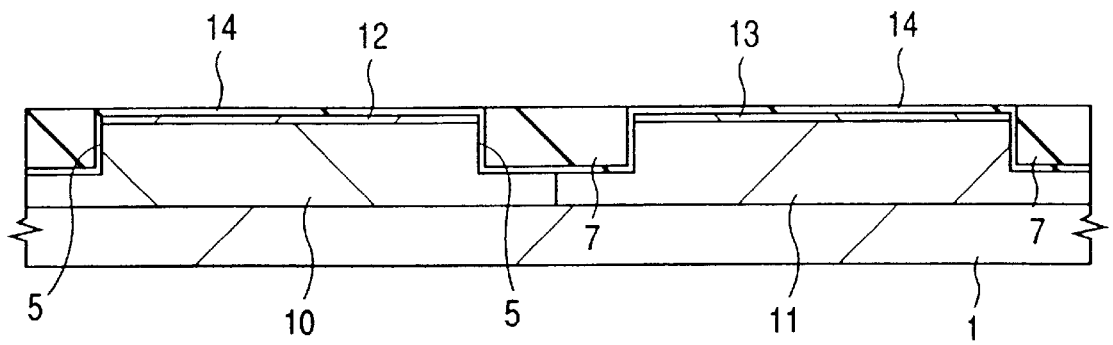
FIG. 16 is a sectional view of an essential part illustrating a method for fabricating a semiconductor integrated circuit device according to embodiment 1 of the invention.

Next, oxygen and hydrogen are introduced into the reactor 141 of the moisture generator 140 for 15 seconds, and the resultant water is introduced into the chamber 120 along with oxygen to oxidize the surface of the semiconductor wafer 1A for 5 minutes, thereby forming a 4 nm thick gate oxide film 14, for example (FIG. 16).

When oxygen and hydrogen are introduced into the reactor 141, attention should be paid to the fact that hydrogen is not introduced thereinto prior to oxygen. If hydrogen is introduced prior to oxygen, a danger may be involved in that unreacted hydrogen is flown into the hot chamber 120. On the other hand, when oxygen is introduced prior to hydrogen, this oxygen is flown into the chamber 120, with the possibility that an oxide film of low quality is formed on the surface of waiting semiconductor wafer 1A. Accordingly, hydrogen and oxygen should be introduced at the same time. Alternatively, while taking safety on work into account, hydrogen is introduced slightly later than oxygen (within a range of from 0 to 5 seconds). In doing so, a thickness of an initial oxide film, which is undesirably formed on the surface of the semiconductor wafer 1A, can be minimized.

Figure 17:
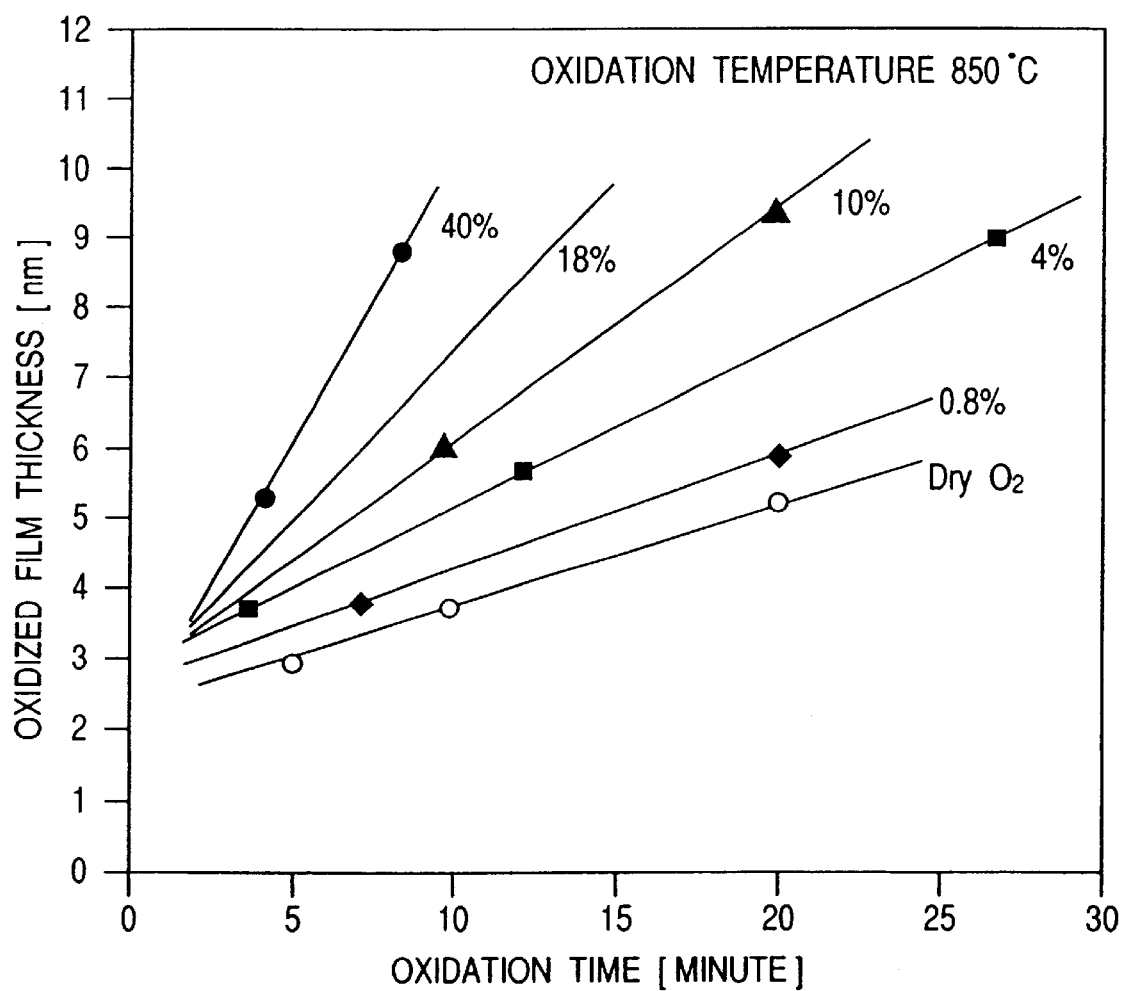
FIG. 17 is a graph showing the dependence of a moisture concentration on an oxide film growth rate.

FIG. 17 is a graph showing the dependence of the moisture concentration on the oxide film growing rate, in which the abscissa indicates an oxidation time and the ordinate indicates an oxide film thickness. As shown, the oxide film growing rate is slowest when the moisture concentration is at 0 (dry oxidation), and increases as the moisture concentration increases. Accordingly, in order to uniformly form a very thin gate oxide film, which has a thickness of approximately 5 nm or below, in high fidelity, it is effective to form the film under stable oxidizing conditions where the moisture concentration should be so low as to decrease the oxide film-growing rate.

Figure 18:
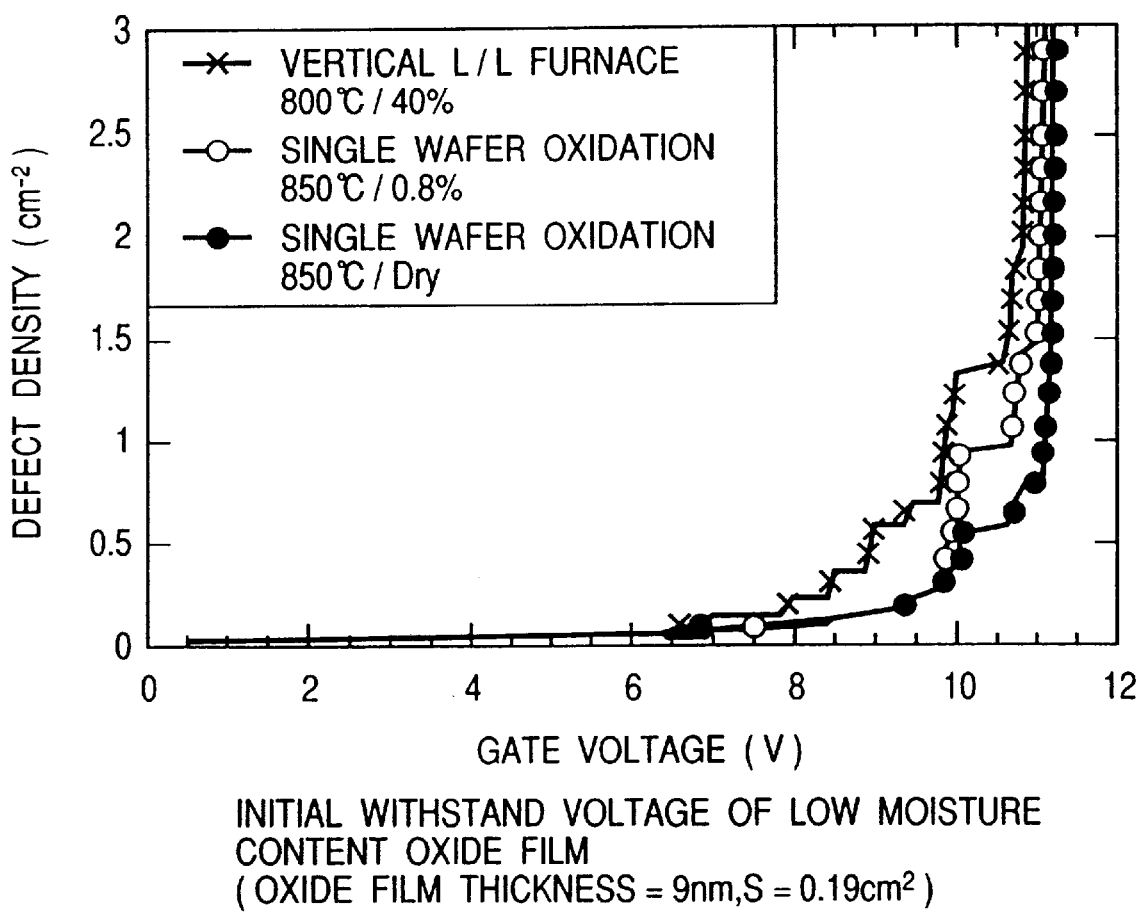
FIG. 18 is a graph showing the dependence of a moisture concentration on an initial withstand pressure of an oxide film of an MOS diode.

FIG. 18 is a graph showing the dependence of the moisture concentration on the initial breakdown voltage of an oxide film of an MOS diode constituted of a semiconductor substrate, a gate oxide film and a gate electrode. In the graph, the abscissa indicates a voltage applied to one electrode (gate electrode) of the MOS diode, and the ordinate indicates a density of defects in the gate oxide film. In order to emphasize the influence of a moisture concentration, such MOS diodes are used wherein a gate oxide film having a thickness of 9 nm and an area of 0.19 $cm^2$ is formed under different conditions of (1) oxidation temperature=850° C. and moisture concentration=0, (2) oxidation temperature=850° C. and moisture concentration= 0.8%, and (3) oxidation temperature=800° C. and moisture concentration=40% created by use of a vertical diffusion furnace. As shown in the figure, the gate oxide film formed under low moisture conditions of moisture concentration= 0.8% is better in the initial breakdown voltage than the gate oxide film formed at moisture content=0 (dry oxidation) and the gate oxide film formed under high moisture conditions of moisture concentration=40%.

Figure 19:
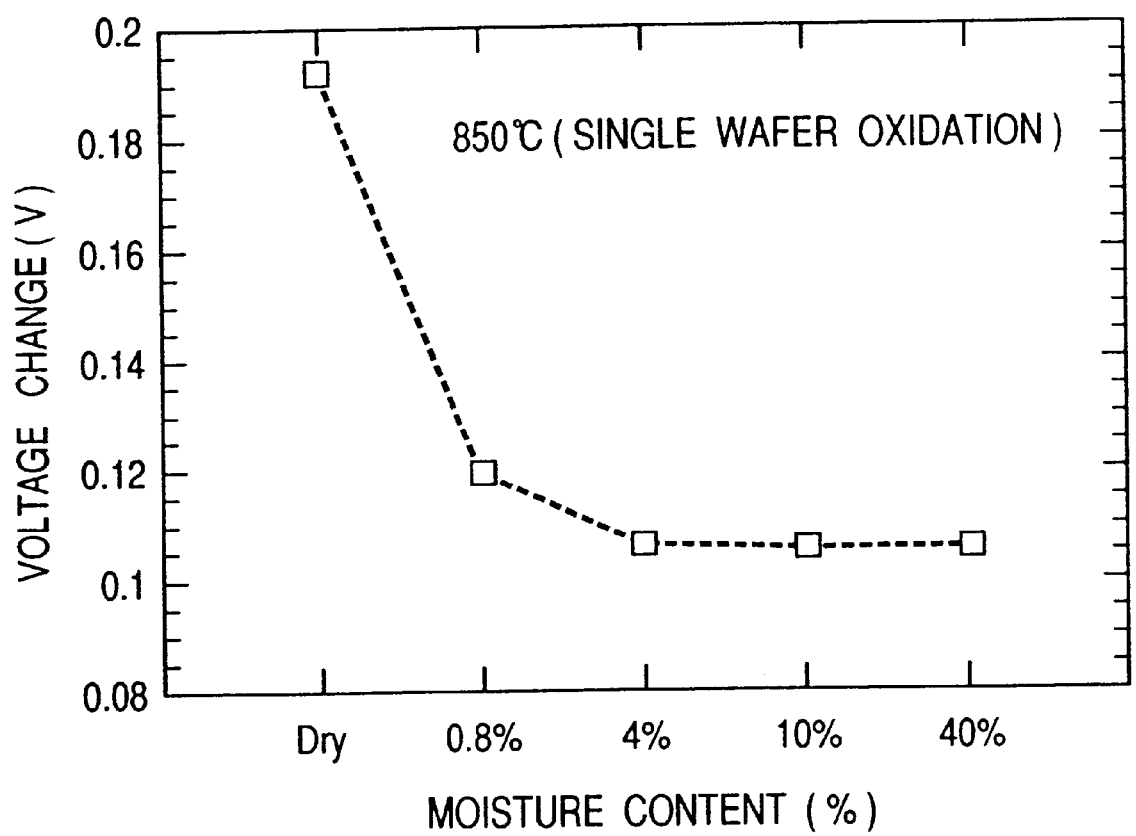
FIG. 19 is a graph showing the dependence of a moisture concentration on an initial breakdown voltage of an oxide film of an MOS diode.

FIG. 19 is a graph showing the dependence of the moisture concentration on the variation in voltage when a constant current is passed between electrodes of each of the MOS diodes. As shown in the figure, the MOS diode using the gate oxide film formed at moisture concentration=0 (dry oxidation) has a greater variation in the voltage ascribed to a high density of defects in the oxide film.

Figure 20:
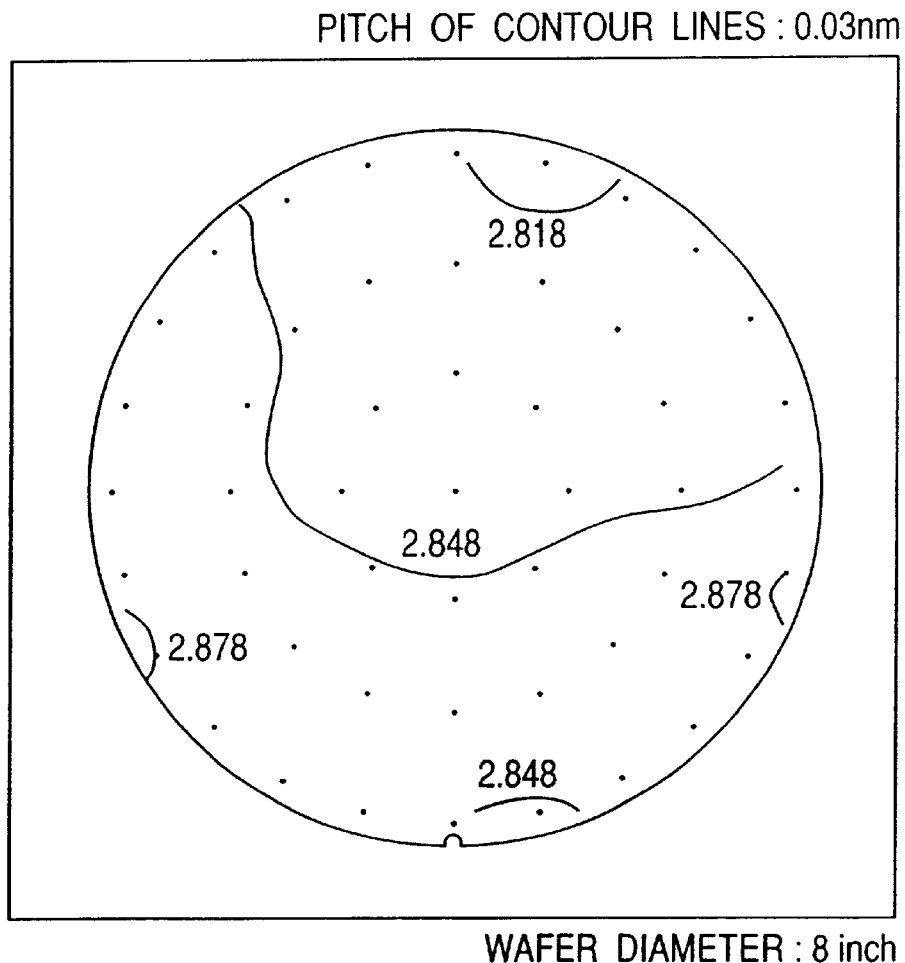
FIG. 20 is an illustrative view showing a distribution of film thickness in the wafer inplane of a gate oxide film.

FIG. 20 shows a film thickness distribution in the wafer inplane of the gate oxide film formed by use of the oxide film-forming apparatus 100. For this purpose, a wafer temperature is set at 850° C., at which oxidation is effected at moisture concentration=0.8% for 2 minutes and 30 seconds. As shown in the figure, the film thickness is such that maximum value=2.881 nm and minimum value=2.814. Thus, good inplane uniformity is obtained, in which a variation of the film thickness is within ±1.8%.

From the foregoing, a preferred concentration (water/water+oxygen) of water introduced into the chamber of the oxide film-forming unit 107 is within a range of from a lower limit which is determined at a concentration sufficient to provide an initial breakdown voltage better than that attained by formation through dry oxidation (moisture concentration=0), to an upper limit of approximately 40% which is attained when adopting a conventional combustion system. Especially, in order to form a very thin gate oxide of high quality having a thickness of approximately 5 nm or below in a uniform thickness and in high fidelity, it may be concluded that a preferred concentration of water is within a range of from 0.5 to 5%.

Figure 21:
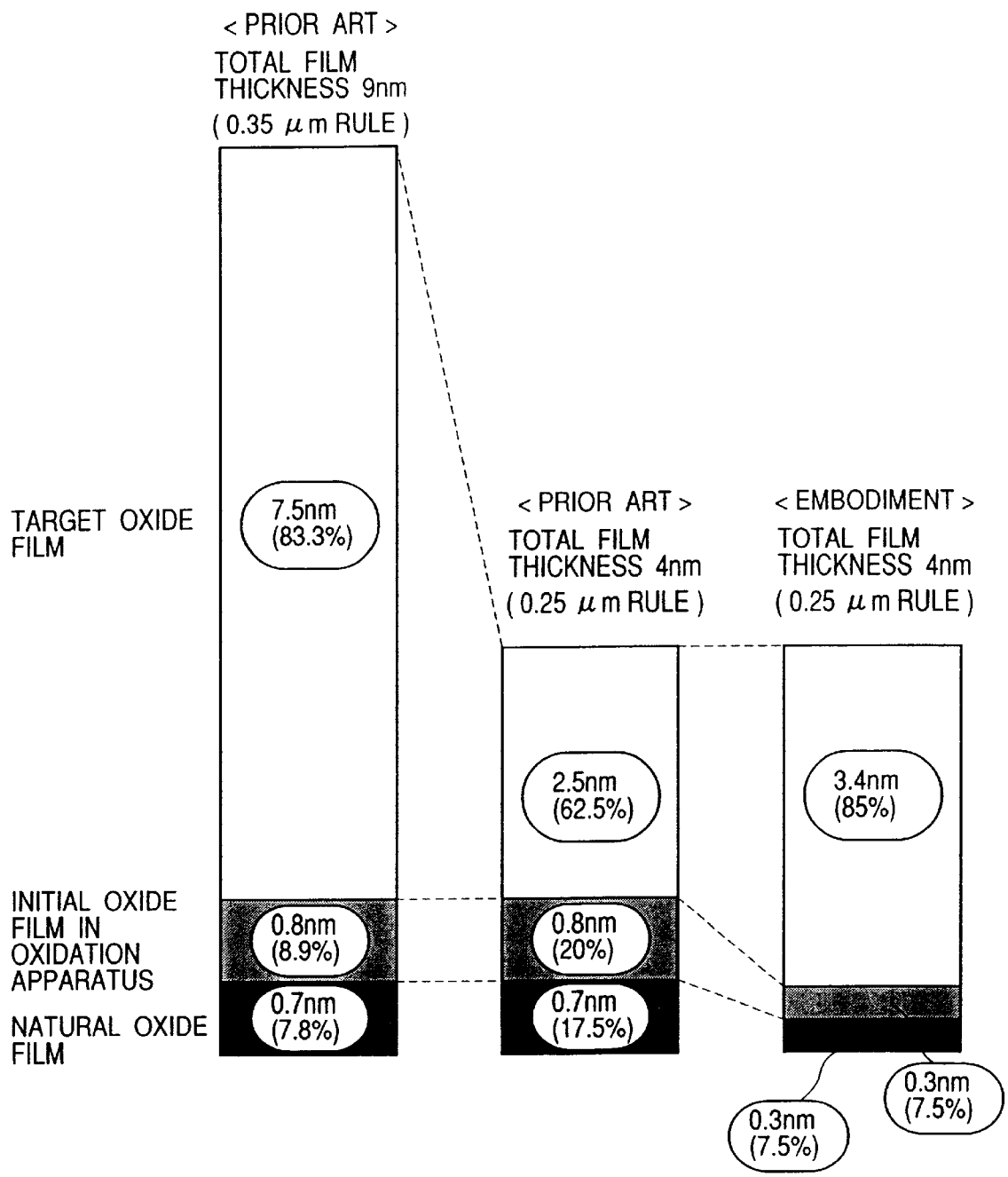
FIG. 21 is a graph showing the details of components in an oxide film.

FIG. 21 shows the details of components in the gate oxide film obtained by thermal oxidation. The graph on the right-hand side of the figure is for a 4 nm thick gate oxide film formed according to a method of this embodiment, the graph at the center is for a 4 nm thick gate oxide film formed according to a conventional method using a combustion system, and the graph at the left-hand side is for a 9 nm thick gate oxide film formed by such a conventional method as mentioned above.

As shown in the figure, the embodiment of the invention makes use of the cleaning-oxidizing through treatment system wherein contact with oxygen in the atmosphere is avoided to an extant as much as possible during the time of from initial cleaning till the formation of an oxide film. As a result, the thickness of a natural oxide film, which is formed prior to the formation of an oxide film capable of being controlled within the oxide film-forming apparatus, can be reduced from 0.7 nm formed by the conventional method (17.5% of the total film thickness) to 0.3 nm (7.5% of the total film thickness). Moreover, when a water generating system using a catalyst is adopted and species for oxidation are instantaneously introduced into the oxide film-forming apparatus, the thickness of an initial oxide film, which is undesirably formed by contact with oxygen in the species for oxidation prior to the formation of an intended, intrinsic oxide film, can be reduced from 0.8 nm attained by the conventional method (20% of the total film thickness) to 0.3 nm (7.5% of the total film thickness). Eventually, there can be formed a very thin gate oxide film of high quality wherein the intended, intrinsic and controllable oxide film in occupies 85% of the total thickness. As stated before, the film is formed under stable oxidation conditions where a moisture concentration in oxidizing species is optimized and an oxide film-growing rate is lowered, with the result that there can be formed a high-quality, very thin oxide film in a uniform thickness and in high fidelity.

Next, a CMOS process subsequent to the formation of the gate oxide film is briefly illustrated.

As shown in FIG. 14, after completion of the formation of the gate oxide film 14, a purge gas is introduced into the chamber 120 of the oxide film-forming unit 107 for 2 minutes and 20 seconds, thereby causing the oxidizing species left in the chamber 120 to be discharged therefrom. Subsequently, the semiconductor wafer 1A is unloaded from the susceptor 123 in 55 seconds and transferred from the chamber 120.

Thereafter, the semiconductor wafer 1A is transferred to the oxide and nitride film-forming chamber 108 as shown in FIG. 9, in which the semiconductor wafer 1A is thermally treated in an atmosphere of NO (nitrogen oxide) or $N_2O$ (nitrous oxide) so that nitrogen is caused to be segregated at the interface between the gate oxide film 14 and the semiconductor substrate 1.

When the gate oxide film 14 is as thin as approximately 5 nm, a strain, which is caused at the interface owing to the difference in thermal expansion coefficient with the semiconductor substrate 1, is visualized, thereby inducing occurrence of hot carriers. The nitrogen segregated at the interface with the semiconductor substrate 1 contributes to relaxation of the strain, and thus, the oxidizing and nitriding treatment can improve the reliability of the very thin gate oxide film 14. It will be noted that when $NO_2$ is used for oxidizing and nitriding treatment, oxidation with oxygen generated through decomposition of $NO_2$ proceeds, so that the gate oxide film 14 becomes thicker by approximately 1 nm. In this case, after formation of a 3 nm thick gate oxide film in the oxide film-forming unit 107, the oxidizing and nitriding treatment is effect to set the gate oxide film thickness at 4 nm. On the other hand, when using NO, there is little chance of increasing the thickness of the gate oxide film through the oxidizing and nitriding treatment.

Next, the semiconductor wafer, which has completed the oxidizing and nitriding treatment, is cooled down to room temperature in a cleaning stage 109 and transferred through the loader/unloader 110 to outside of the oxide film-forming apparatus 100, followed by further transfer to a CVD device (not shown) for depositing a conductive film for gate electrode. At this time, the CVD device is connected at the downstream of the oxide film-forming apparatus 100, and a process covering from the formation of the gate oxide film to the deposition of a conductive film for gate electrode is carried out by a through treatment, thereby effectively preventing the gate oxide film 14 from pollution.

Figure 22:
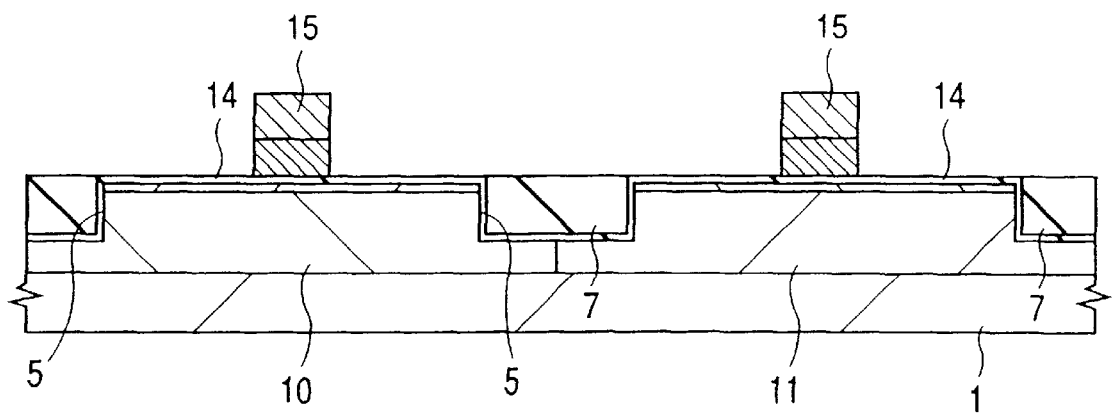
FIG. 22 is a sectional view of an essential part illustrating a method for fabricating a semiconductor integrated circuit device according to embodiment 1 of the invention.

Next, as shown in FIG. 22, gate electrodes 15 having a gate length of 0.25 μm are formed on the top of the gate oxide film 14. The gate electrodes 15 are formed by successively depositing, on the semiconductor substrate 1, a 150 nm thick n-type polysilicon film and a 150 nm thick non-doped polysilicon film, followed by pattering these films by dry etching through a photoresist mask.

Figure 23:
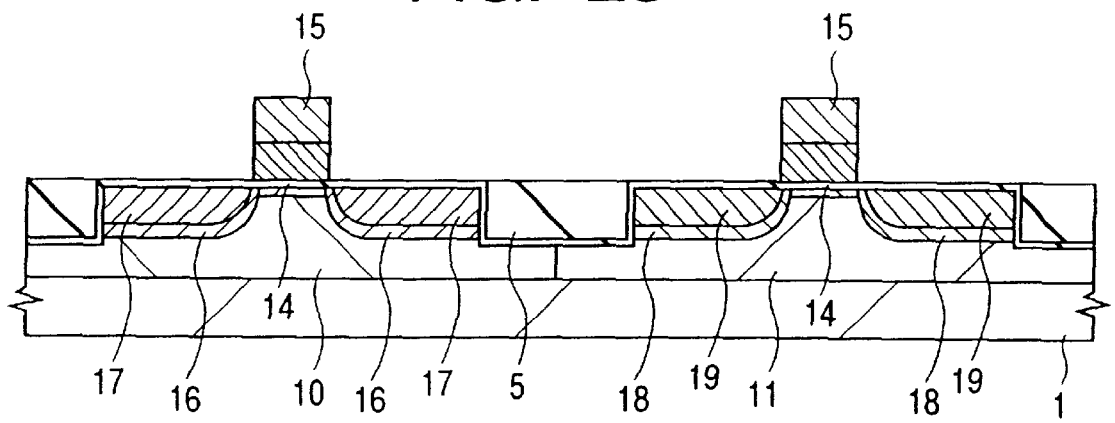
FIG. 23 is a sectional view of an essential part illustrating a method for fabricating a semiconductor integrated circuit device according to embodiment 1 of the invention.

Then, as shown in FIG. 23, a p-type impurity, e.g. B (boron), is ion-implanted into a p channel-type MOSFET-forming region from a vertical or oblique direction, thereby forming a p⁻type semiconductive region 16 and a p-type semiconductive region 17 in an n-type well 10 at opposite sides of the gate electrode 14. Likewise, an n-type impurity, e.g. P (phosphorus), is ion-implanted into an n channel-type MOSFET-forming region from a vertical or oblique direction, thereby forming an n⁻type semiconductive region 18 and an n-type semiconductive region 19 in a p-type well 11 at opposite sides of the gate electrode 14.

Figure 24:
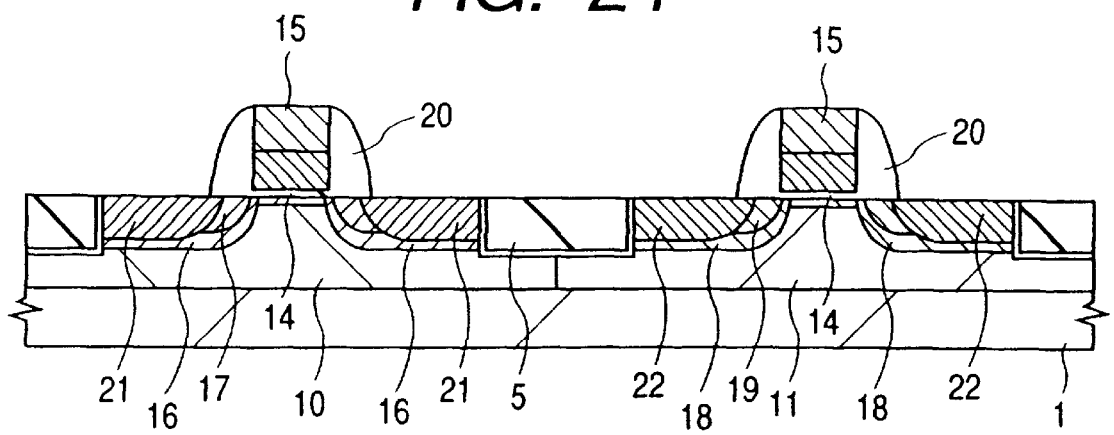
FIG. 24 is a sectional view of an essential part illustrating a method for fabricating a semiconductor integrated circuit device according to embodiment 1 of the invention.

Next, as shown in FIG. 24, the silicon oxide film deposited on the semiconductor substrate 1 by a CVD method is subjected to anisotropic etching to form a side wall spacer 20 having a thickness of about 0.15 μm on side walls of the gate electrode 14. At that time, the gate oxide film 14 formed at the upper portion of the p-type semiconductive region 17 and the gate oxide film 14 formed at the upper portion of the n-type semiconductive region 19 are removed. Subsequently, a p-type impurity, e.g. B (boron), is ion-implanted into the p channel-type MOSFET-forming region to form a p⁺-type semiconductive region in the n-type well 10 at opposite sides of the gate electrode 14. Likewise, an n-type impurity, e.g. P (phosphorus), is ion-implanted into the n channel-type MOSFET-forming region to form an n+-type semiconductive region 22 in the p-type well at opposite sides of the gate electrode 14.

Figure 25:
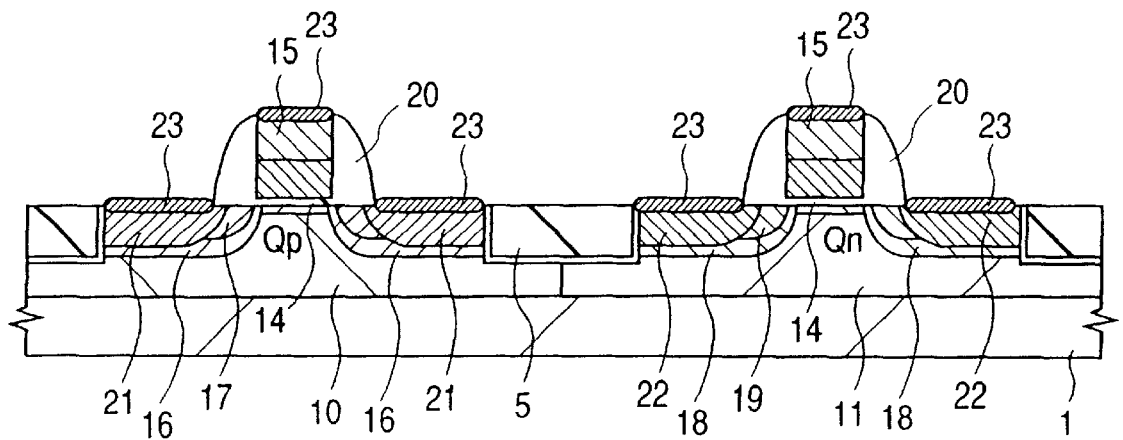
FIG. 25 is a sectional view of an essential part illustrating a method for fabricating a semiconductor integrated circuit device according to embodiment 1 of the invention.

Then, as shown in FIG. 25, a TiSi$_2$ (titanium silicide) layer 23 is, respectively, formed on the surfaces of the gate electrode 14 of the p channel-type MOSFET, the p+-type semiconductive regions 21 (a source region and a drain region), the gate electrode 14 of the n channel-type MOSFET, and the n+-type semiconductive regions 22 (a source region and a drain region). The TiSi$_2$ layer 23 is formed by depositing a Ti film on the semiconductor substrate 1 by sputtering, and thermally treating the Ti film for reaction with the semiconductor substrate 1 and the gate electrode 14, followed by removal of an unreacted Ti film by etching. According to these steps, a P channel-type MOSFET (Qp) and an n channel-type MIDFET (Qn) are completed.

Figure 26:
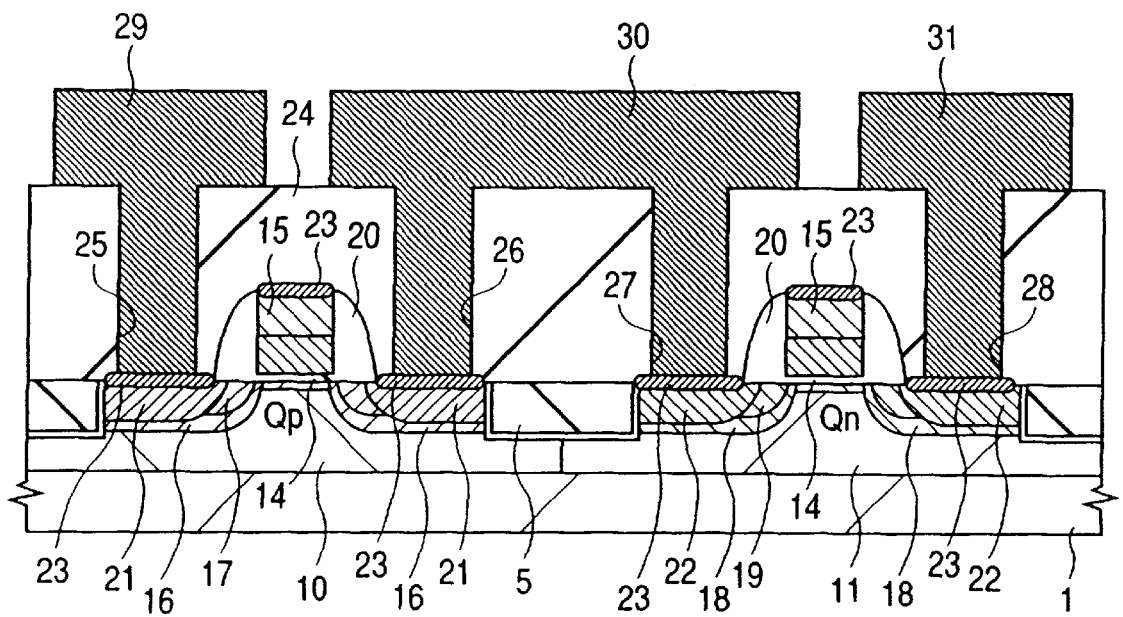
FIG. 26 is a sectional view of an essential part illustrating a method for fabricating a semiconductor integrated circuit device according to embodiment 1 of the invention.

As shown in FIG. 26, connection holes 25 to 28 are formed in a silicon oxide film deposited on the semiconductor substrate 1 according to a plasma CVD method, and an Al alloy film, which is deposited on the silicon oxide by sputtering, is patterned to provide interconnections 29 to 31, thereby substantially completing the CMOS process of this embodiment.

(Semiconductor Process B)

The method for fabricating MOSFET according to this embodiment (LOCOS isolation process) is illustrate with reference to FIGS. 27 to 32. In this process, known isolation is used in place of shallow trench isolation (STI). In this case, although limitation is placed on fineness, a hitherto known process may be conveniently employed as it is. In any of STI or SGI (shallow groove isolation) of a semiconductor process, or the LOCOS isolation of this embodiment, MOSFET is principally surrounded therearound with isolation regions provided that it shares a source or drain with other transistors.

Figure 27:
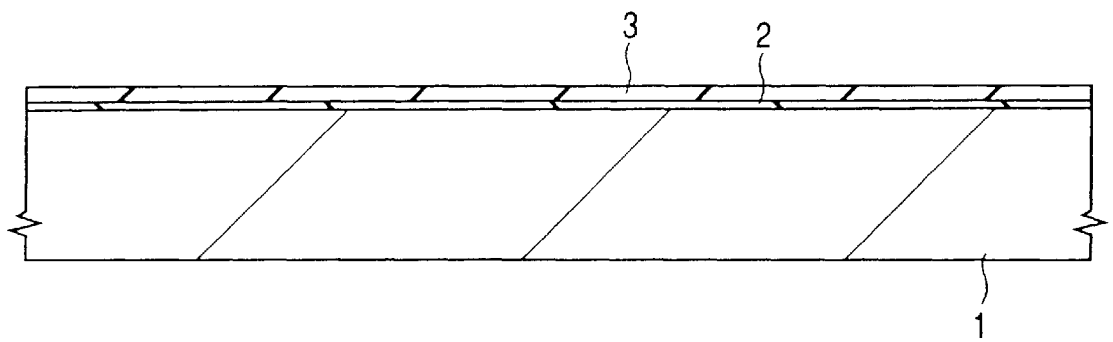
FIG. 27 is a sectional view of an essential part illustrating a method for fabricating a semiconductor integrated circuit device according to embodiment 2 of the invention.
Figure 28:
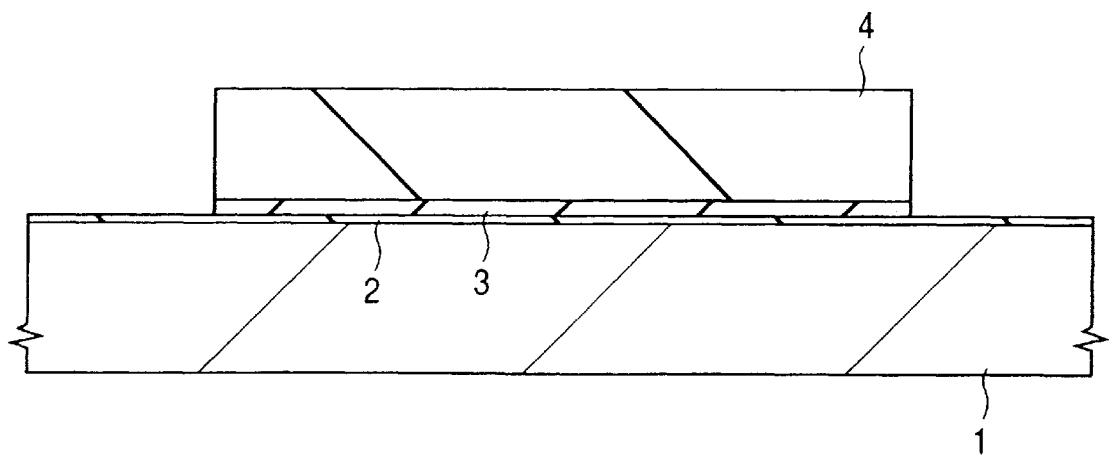
FIG. 28 is a sectional view of an essential part illustrating a method for fabricating a semiconductor integrated circuit device according to embodiment 2 of the invention.

As shown in FIG. 27, a semiconductor substrate is thermally treated to form a thin silicon oxide film 2 having a thickness of approximately 10 nm on a main surface thereof (thermal oxidation process B1), followed by deposition of an approximately 100 nm thick silicon nitride film 3 on the silicon oxide film 2 by a CVD method. Next, as shown in FIG. 28, a photoresist 4 having an opening for an element isolation region is formed on the silicon nitride film 3, followed by patterning of the silicon nitride film 3 through the mask of the photoresist 4.

Figure 29:
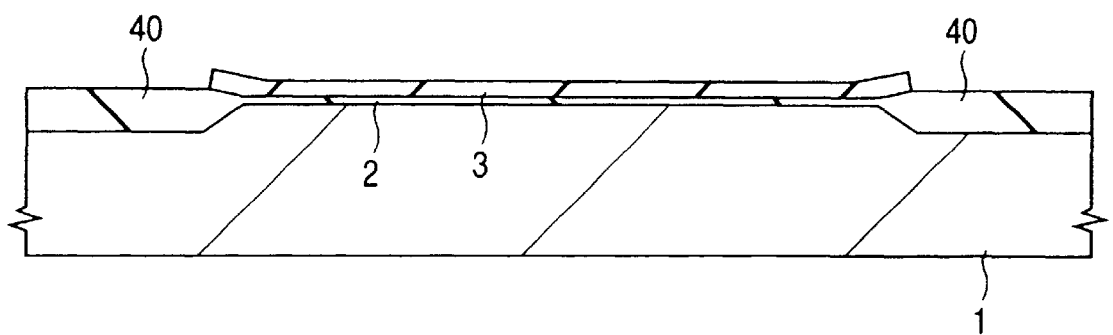
FIG. 29 is a sectional view of an essential part illustrating a method for fabricating a semiconductor integrated circuit device according to embodiment 2 of the invention.
Figure 30:
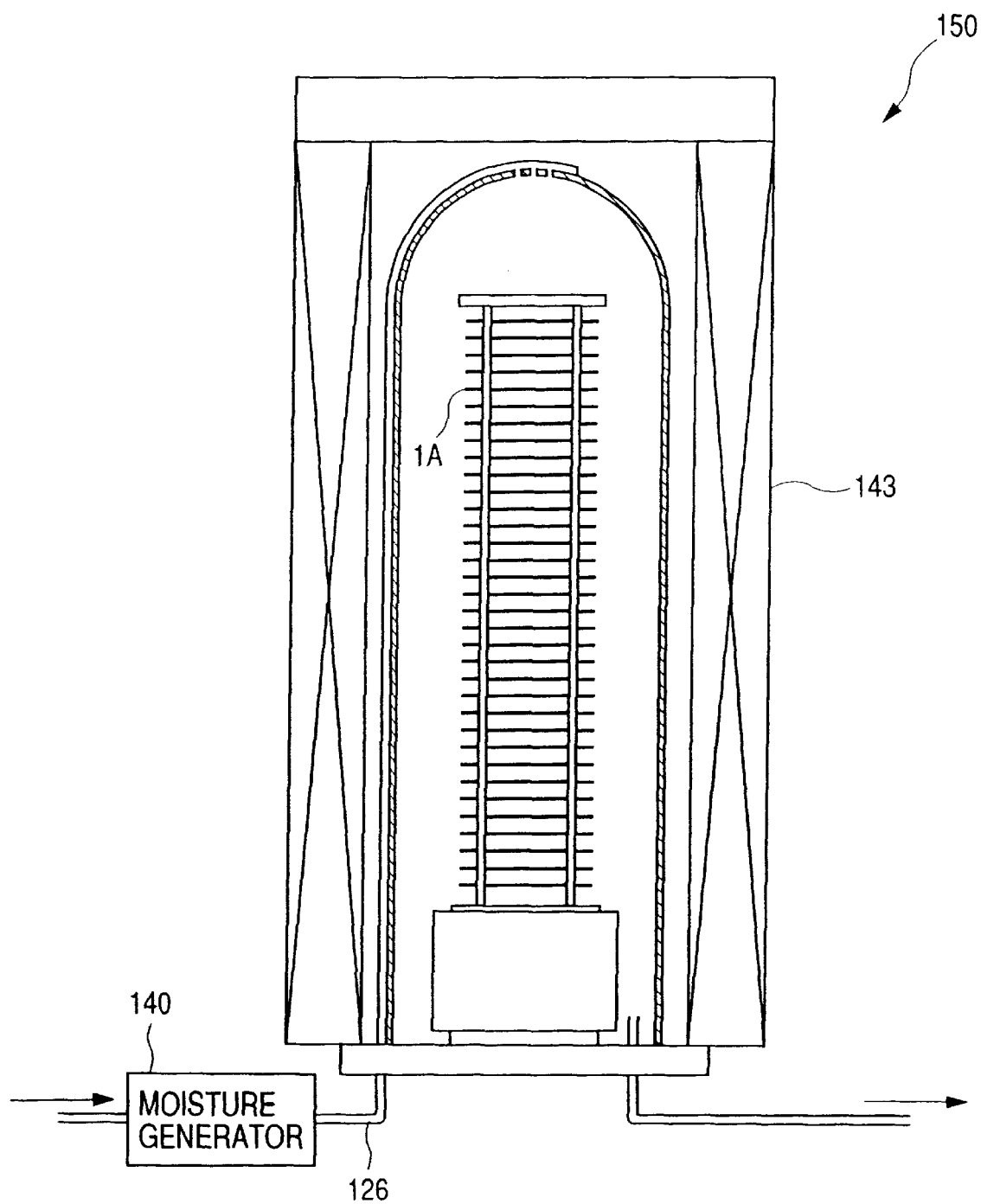
FIG. 30 is a sectional view showing other example of an arrangement of an oxide film forming chamber.

After removal of the photoresist 4, as shown in FIG. 29, the semiconductor substrate 1 is thermally treated to form a field oxide film on the element isolation region (thermal oxidation process B2).

Figure 32:
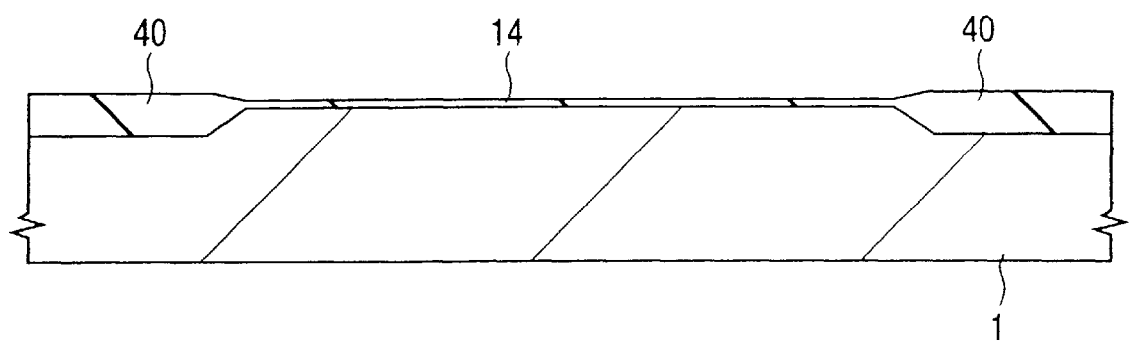
FIG. 32 is a sectional view of an essential part illustrating a method for fabricating a semiconductor integrated circuit device according to embodiment 2 of the invention.

The silicon nitride film 3 is removed by wet etching with hot phosphoric acid, and the semiconductor substrate 1 is subjected to wet cleaning on the surface thereof, followed by forming a very thin gate oxide film 14 having a thickness of 5 nm or below on the surface of an active region of the semiconductor substrate 1 in the same manner as in Embodiment 1 (thermal oxidation process B3) (FIG. 32).

Figure 31:
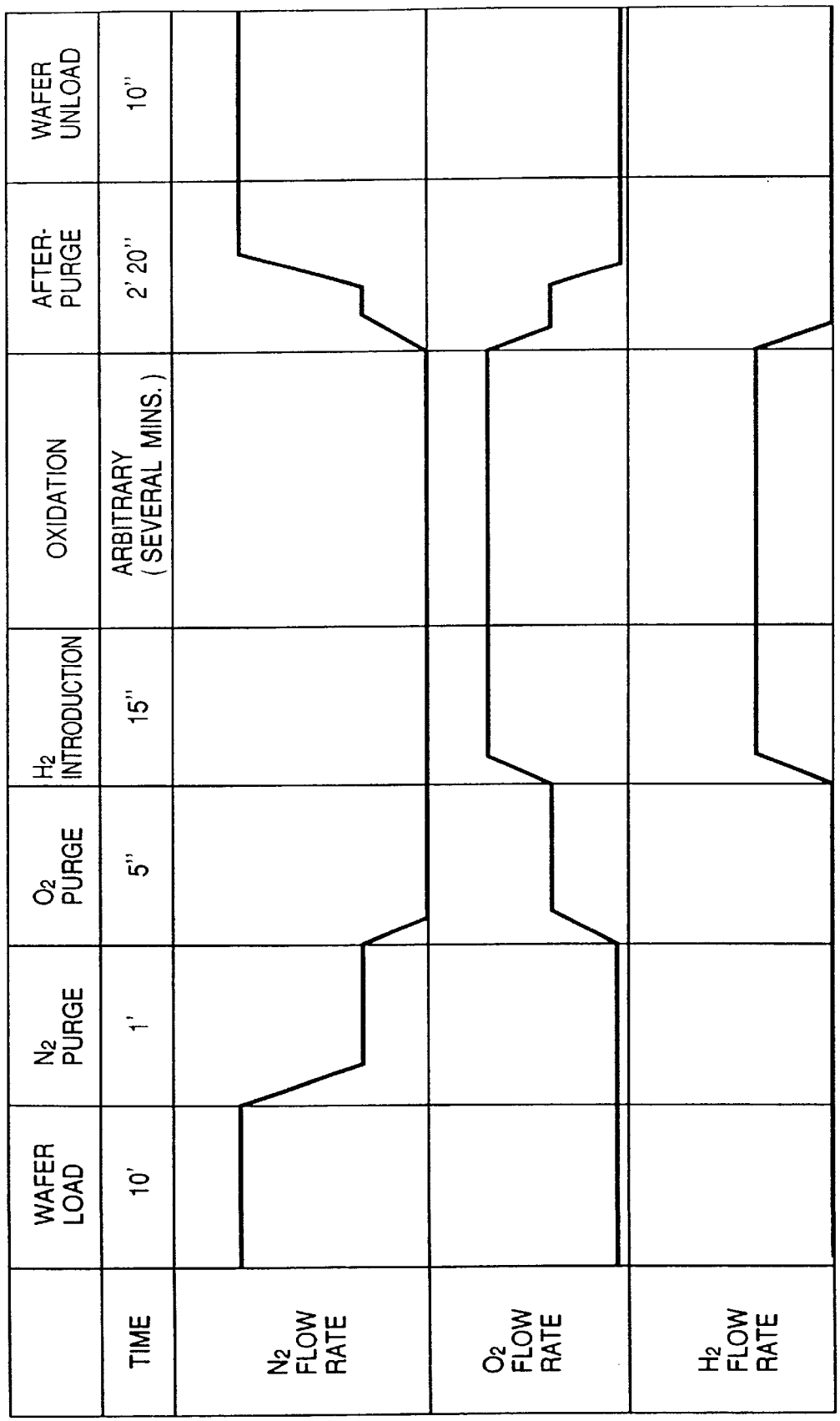
FIG. 31 is an illustrative view showing an example of a sequence of the formation of a gate oxide film.

The very thin gate oxide film having a thickness of 5 nm or below may be formed by attachment of such a moisture generator of a catalyst type as set out before to a batch-type vertical oxide film-forming device 150 (oxidation device 3; vertical batchwise oxidation furnace). An example of a sequence of forming a gate oxide film using this vertical oxide film-forming device 150 is shown in FIG. 31. The sequence of this case is substantially similar to that of FIG. 15, but there is a slight timewise difference with respect to loading and unloading of a wafer. As illustrated before, this case is generally of the hot wall type wherein it is relatively important that oxygen gas be added to a purge gas in a small amount sufficient not to substantially cause any oxidation.

Thereafter, MOSFET is formed on the main surface of the semiconductor substrate 1 in the same manner as in Embodiment 1.

(Common Matters Relative to a Oxidation Process, etc.)

The details of treating apparatus and process commonly applicable to the respective semiconductor processes disclosed in the present invention are described.

As having set out before, FIG. 9 is a schematic view showing a single wafer-type oxide film-forming apparatus (a multiple-chamber system) used for the formation of a gate oxide film. As shown, the oxide film-forming apparatus 100 is connected downstream of the cleaning device 101 wherein the semiconductor wafer 1A is subjected to a wet cleaning system (although a dry system may be used) to remove an oxide film (generally called a surface film) from the surface thereof prior to the formation of a gate oxide film. When adopting such a cleaning-oxidizing through treatment system, the semiconductor wafer 1A, which has been subjected to cleaning within the cleaning device 101, can be transferred to the oxide film-forming apparatus within a short time without contact with the air (generally including an undesirable oxidative atmosphere or other atmospheres which cause the surface state to be deteriorated). Accordingly, it is suppressed to the minimum to form a natural oxide film on the surface of the semiconductor wafer 1A during the course of from the removal of the oxide film to the formation of a gate oxide film.

The semiconductor wafer 1A obtained after completion of the dry treatment is immediately transferred to the oxide film-forming apparatus 100 through a buffer 106.

This oxide film-forming apparatus 100 is constituted of a multiple chamber system provided, for example, with the oxide film-forming chamber 107, the oxide and nitride film-forming chamber 108, the cleaning stage 109, the loader/unloader 110 and the like. The transfer system 112 located at the center of the apparatus has robotic hands for transferring the semiconductor wafer 1A to (from) the above treating chambers. The transfer system 112 may be kept in an atmosphere of an inert gas such as nitrogen or the like (although it may be kept in vacuum, a positive pressure, such as with an inert gas or the like, has the effect of preventing an undesirable gas from being incorporated from outside or other treating chambers) in order to minimize the formation of natural oxide film on the surface of the semiconductor wafer 1A by incorporation of the air. Moreover, in order to minimize deposition of moisture on the surface of the semiconductor wafer 1A, the transfer system is kept therein in an atmosphere of a super low moisture content at a level of ppb (the moisture ordinarily contained in a well set-up, de-gassed vacuum system is at several ppm or below). The semiconductor wafer transferred to the oxide film-forming apparatus is transferred to the oxide film-forming unit 107 through the robotic hands 113 by a single wafer unit or a two-wafer unit (in general, the term "single wafer" means a one-wafer or two-wafer unit, and where a single-wafer unit or a two-wafer unit is specified, they are, respectively, called a single wafer or two wafers).

As described before, FIG. 11(a) is a schematic plan view showing an example of a specific arrangement of the oxide film-forming unit 107 (i.e. a single wafer apparatus of FIG. 9), wherein FIG. 11(b) is a sectional view taken along line B–B' of FIG. 11(a) (oxidizing apparatus 1; a hot wall-type single wafer oxidizing furnace).

The oxide film-forming unit 107 is provided with the chamber 120 constituted of a multiple-wall quartz tube, and has heaters 121a, 121b (in the case of a hot wall type) for heating the semiconductor wafer 1A at upper and lower portions thereof, respectively. The chamber 120 accommodates therein a disk-shaped soaking ring 122 capable of uniformly dispersing heat, supplied from the heaters 121a, 121b, throughout the surfaces of the semiconductor wafer 1A, with a susceptor 123 being disposed thereabove for keeping the semiconductor wafer 1A substantially horizontal (when the wafer surface is arranged substantially horizontal relative to vertical gravitational attraction, the influence in concentration distribution of a mixed can be excluded, which is especially important for the formation of a large-sized wafer such as a 300φ wafer). The soaking ring 122 is constituted of a heat-resistant material such as quartz or SiC (silicon carbide), and is supported with a support arm 124 extending from the wall surface of the chamber 120. In the vicinity of the soaking ring 122, there is disposed a thermocouple 125 for measuring a temperature of the semiconductor wafer 1A held with the susceptor 123. The semiconductor wafer 1A may be heated by heating systems including, aside from a heating system including the heaters 121a, 121b, a heating system using a lamp 130 shown, for example, in FIG. 12 (oxidation apparatus 2; lamp heating-type single wafer oxidizing furnace). In the case, the lamp heating may be started after a wafer is set in position, and the wafer surface temperature rapidly lowers by turning the lamp off. Eventually, the formation of an initial oxide film, which is formed at the time of insertion or withdrawal such as in the case of a hot wall system, can be reduced to a negligible extent. It will be noted that where moisture is added to by use of a lamp, it is effective to preheat not only a moisture supply portion, but also an oxidizing furnace to a level of about 140° C. to prevent moisture condensation.

The chamber 120 is connected at part of a wall surface thereof with one end of a gas introduction pipe 126 for introducing water, oxygen and a purge gas into the chamber 120. The gas introduction pipe 126 is connected at the other end thereof with a moisture generator of a catalyst type. In the vicinity of the gas introduction pipe 126, there is disposed a partition wall 128 having a multitude of through-holes 127, and the gas introduced into the chamber is uniformly passed throughout the chamber through the through-holes 127 of the partition wall 128. At other part of the wall surface of the chamber 120, there is connected one end of an exhaust pipe 129 for exhausting the gas introduced into the chamber 120.

As stated hereinbefore, FIGS. 13 and 14 are, respectively, a schematic view showing a moisture generator of a catalyst type connected to the chamber 120. The moisture generator 140 is provided with a reactor 141 made of a heat and corrosion-resistant alloy (such as a Ni alloy known under the commercial name of "Hasterlloy"), in which there are accommodated a coil 142 made of a catalytic metal such as Pt (platinum), Ni (nickel), or Pd (palladium), and a heater 143 for heating the coil 142.

A process gas comprising hydrogen and oxygen, and a purge gas made of an inert gas such as nitrogen or Ar (argon) are introduced into the reactor 141 from gas reservoirs 144I, 144b, 144c through a pipe 145. Mass flow controllers 146a, 146b and 146c and on-off valves 147a, 147b and 147c for turning a gas flow path on or off are, respectively, disposed on the way of the pipe 145. Amounts of gases and component ratios introduced into the rector 141 can be precisely controlled by these means.

The process gas (hydrogen and oxygen) introduced into the reactor is brought into contact with the coil 142 heated to about 350 to 450° C. (e.g. explosive combustion of hydrogen takes place at a hydrogen concentration of 4% or over in the presence of an adequate amount of oxygen under normal pressures, so that taking the safety of a mass production apparatus into account, it is believed desirable that an oxygen-rich oxygen and hydrogen mixed gas is introduced into the reactor so as not to permit hydrogen to be left therein) and excited. As a consequence, hydrogen radicals are produced from hydrogen molecules ($H_2 \rightarrow 2H^+$), and oxygen radicals are produced from oxygen molecules ($O_2 \rightarrow 2O^-$). These two types of radicals are chemically very active, and are quickly reacted to generate water ($2H^+ + O^- \rightarrow H_2O$). This water is diluted by mixing with oxygen in a connection portion 148 at a low concentration, followed by introduction into the chamber 120 of the oxide film-forming unit 107 through the gas introduction pipe 136. In the case, dilution with argon in place of oxygen may be possible. More particularly, the atmosphere supplied to the oxidation furnace is comprised of 1% of moisture and 99% of argon.

Such a moisture generator 140 of the catalyst type as set out above is able to control, in high accuracy, the amounts of hydrogen and oxygen which take part in the formation of water, under which the concentration of water introduced into the chamber of the oxide-film forming unit 107 along with oxygen can be controlled in high accuracy in a wide range of from a super lower concentration on the order of ppt or below to a high concentration of about several tens of %. Simultaneously with the introduction of a process gas into the reactor 141, water is produced, thus obtaining a desired moisture concentration in real time. Accordingly, simultaneous introduction of hydrogen and oxygen into the reactor 141 (usually, oxygen is introduced slightly earlier for safety) is possible, and thus, it is not necessary to introduce oxygen prior to hydrogen, like a known water generating system using a combustion system. It is to be noted that a catalytic metal in the reactor may be any ones other than metals and capable of converting hydrogen and oxygen into corresponding radicals as set out before. Moreover, the catalytic metal may be processed in the form of a coil. Alternatively, the metal may processed, for example, into a hollow tube or a fine fiber filter, through which a process gas may be passed.

In FIG. 14, the moisture generator 140, a hydrogen sensor, a filter, a dilution unit, a supply unit for a purge gas or diluted gas, a connection portion of an oxidizing furnace, and the like may be controlled in temperature or heated to about 140° C. so as to prevent moisture condensation. The hydrogen sensor is provided to detect hydrogen which is left unreacted. The filter is a gas filter which is inserted for serving as a kind of orifice, by which in the event that combustion of hydrogen is combusted at the side of the oxidizing furnace, the combustion is not arrived at the side of the preparation furnace. Although a purge gas, diluted gas and moisture are supplied to the oxidizing furnace after preheating to a temperature sufficient not to cause moisture condensation (usually at a temperature of from 100 to 200° C.) (thee diluted gas is mixed with the generated moisture after preheating), consideration should be taken on preheating of the furnace or a wafer to be treated in a lamp heating furnace. In this case, a wafer in the oxidizing furnace may be preheated with a purge gas. Especially, with a lamp heating furnace, care should be taken to a preheating mechanism for preventing condensation in a wafer-introducing portion. In either case, heating or temperature control to a level of about 140° C. is relatively effective. The oxidation process is usually carried out under stationary conditions where a given atmospheric gas is supplied to the oxidation unit at a given flow rate, and consumed components are supplemented by supplying a fresh atmospheric gas.

An example of a sequence of the formation of a gate oxide film using the oxide film-forming apparatus 100 (FIG. 9) is illustrated with reference to FIG. 15.

The chamber 120 (FIG. 11) of the oxide film-forming unit 107 is opened. While feeding a purge gas (nitrogen) thereinto (wherein a slight amount of oxygen or the like may be added to the purge gas in order to prevent the wafer from being surface roughened such as by thermal etching as shown in FIG. 15), the semiconductor wafer 1A is loaded on the susceptor 123. The time of from the transfer of the semiconductor wafer 1A to the chamber 120 till the loading on the susceptor 123 is 55 seconds. Thereafter, the chamber 120 is closed, followed by further introduction of the pure gas into the chamber 120 for satisfactory gas substitution. The susceptor 123 is heated beforehand by means of the heaters 121*a*, 121*b* so that the semiconductor wafer 1A is rapidly heated. The heating temperature of the semiconductor wafer 1A is within a range of 800 to 900° C., e.g. at 850° C. If the wafer temperature is 800° C. or below, the resultant gate oxide film lowers in quality. On the other hand, when the temperature is over 900° C., the wafer is liable to be roughened on the surfaces thereof.

When oxygen and hydrogen are introduced into the reactor 141, hydrogen should not be introduced thereinto prior to oxygen. If hydrogen is introduced prior to oxygen, there is the danger that unreacted hydrogen is flown into the hot chamber 120. On the other hand, when oxygen is introduced prior to hydrogen, the oxygen is flown into the chamber 120 to form a low-quality oxide film (initial oxide film) on the surface of a stand-by semiconductor wafer 1A. Accordingly, hydrogen should be introduced simultaneously with oxygen or should be introduced at a timing slightly later than oxygen (within 0 to 5 minutes) while taking safety on work into account. In this way, the thickness of the initial oxide film undesirably formed on the surface of the semiconductor wafer 1A can be reduced to a minimum.

A very thin gate oxide film having a thickness of 5 nm or below (this is likewise effective to some extent against gate or other oxide films having a larger thickness) maybe formed by attaching a moisture generator 160 of a combustion type (an oxidizing device 4; an oxidizing furnace of an oxygen and hydrogen combustion type or a hydrogen combustion type), as shown in FIG. 33, to a single wafer or batch-type oxide film forming apparatus (oxidizing furnaces 1 to 3).

In the above case, oxidation species containing a relatively high concentration of water are generated in the moisture generator 160, to which oxygen is subsequently added to obtain oxidization species having a low moisture concentration. To this end, valves are so set that a valve (Vvent) is opened and a valve (Vprocess) is closed beforehand, so that any oxidation species are not sent to the oxide film-forming apparatus until the moisture concentration lowers to an intended level. When the moisture concentration lowers to a satisfactory extent, the valves are switched so that the valve (Vvent) is closed and the valve (Vprocees) to permit the oxidation species to be sent to the oxide film-forming apparatus.

Although the above system is disadvantageous over the catalyst system in that there is provided a dust-generating source such as valves just before the oxide film-forming apparatus and that a dead space is created by the provision of the valves, this system is able to realize a low moisture concentration in the oxidation species and the suppression of formation of an initial oxide film.

(Semiconductor Process C)

Figure 34:
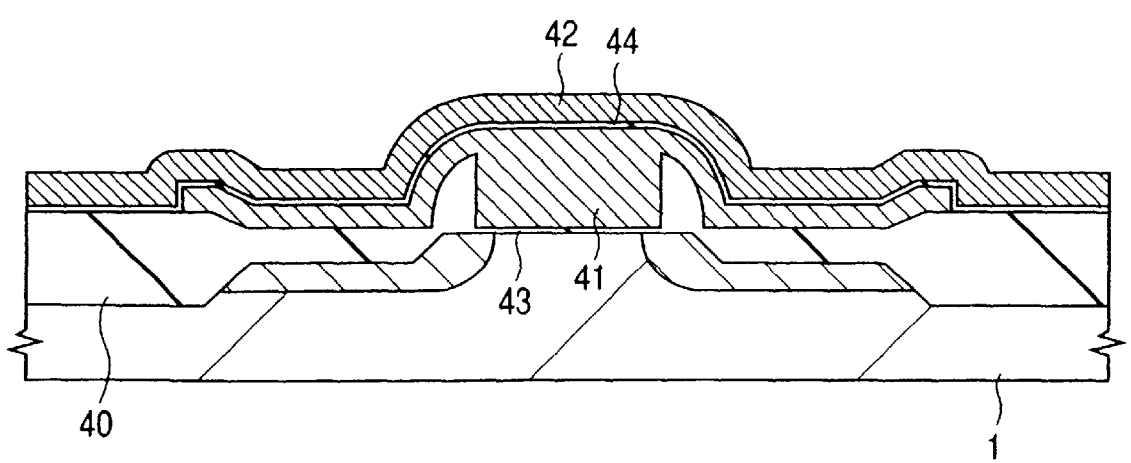
FIG. 34 is a sectional view of an essential part showing another embodiment of a method for fabricating a semiconductor integrated circuit device according to the invention.

The oxide film-forming method of the invention may be applied to the case where, as shown in FIG. 34, a tunnel oxide film 43 (thermal oxidation process C1) of a flash memory having a floating gate 44 and a control gate 42, or a second gate oxide film 44 (thermal oxidation process C2) is formed in a small thickness of 5 nm or below.

(Semiconductor Process D)

The oxide film-forming method of the invention is also applicable to the case where two or more gate oxide films having different thicknesses are formed on the same semiconductor chip as in LSI where there are, for example, a memory LSI and a logic LSI are mounted on a common semiconductor chip. In this case, it is, of course, possible to form both a thin gate oxide film (thermal oxidation process D1) having a thickness of 5 nm or below and a relatively thick oxide film having a thickness of 5 nm or over (thermal oxidation process D2) according to the method of the invention. Alternatively, it is also possible to form a thin gate oxide film according to the method of the invention and a thick gate oxide film according to a conventional method.

(Applicability of Several Oxidation Methods Set Out in the Present Application)

The applicability of the catalytic moisture-generating thermal oxidation method, low moisture oxidation method (including that of a partial hydrogen combustion type) and conventional high moisture content oxidation method of a hydrogen combustion type stated in the instant application is summarized below.

When applied to the catalytic moisture-generating thermal oxidation method and the low moisture oxidation method, the oxidation processes A3, B3, C1, C2, D1 and the like (first grade) are the most effective processes.

Although the high moisture content oxidation of the conventional hydrogen combustion type may also be applicable, effective processes on application to the catalytic moisture-generating thermal oxidation method and the low moisture oxidation method include those oxidation processes A1, A2, B1, B2, D2 and the like (second grade).

Especially, in a line having both an oxidation furnace of the hydrogen combustion type and an oxidation furnace of the catalyst type, the use of both methods is of the practical value depending on the properties and thickness of an oxide film.

(Applicability of Various Oxidation Apparatus Set Out in the Instant Application)

Applicability of several oxidation apparatus set out in the present application is summarized below. The oxidation apparatus 1 to 4 illustrated in this application are all applicable to the oxidation steps of the first and second grades mentioned above. However, when it is necessary to precisely control an atmosphere such as by a multiple chamber, it is desirable to use the oxidation apparatus 1 or 2. As for the working pressure at the time of oxidation of these oxidation apparatus, it is usual to use normal pressures (ranging from 600 Torr to 900 Torr) but a reduced pressure may be used. In the latter case, it becomes easy to set an oxidation rate at a low level, coupled with the additional effect that there can be reduced the possibility of explosion of hydrogen. Moreover, oxidation under high pressure may be possible. The high pressure oxidation has the merit that a high oxidation rate can be realized at relatively low temperatures.

(Modifications and Variations of the Disclosure)

Although the invention made by the present inventors have been particularly described based on the embodiments thereof, the invention should not be construed as limiting to these embodiments and any variations may be possible without departing from the spirit of the invention.

INDUSTRIAL APPLICABILITY

Among the inventions disclosed in the instant application, the effects attained by typical ones are briefly illustrated below.

According to the invention, a high-quality very thin gate oxide film having a thickness of 5 nm or below can be formed in a uniform thickness and in high fidelity, so that the reliability and yield of semiconductor integrated circuit devices having fine MOSFET whose gate length is 0.25 µm or below can be improved.

What is claimed is:

1. A method for fabricating a semiconductor integrated circuit device, comprising the steps of:
   (a) synthesizing moisture, at a first temperature, from oxygen gas and hydrogen gas by use of a catalyst in a moisture synthesizing portion, to produce synthesized moisture;
   (b) transferring the synthesized moisture into a single wafer heat treatment chamber of an oxidation furnace, to form a wet oxidative atmosphere over a first major surface of a wafer inside the chamber, while keeping the moisture in a gaseous state; and
   (c) performing thermal oxidation treatment of a silicon member over the first major surface of the wafer, in the wet oxidative atmosphere in the single wafer heat treatment chamber, by lamp-heating the first major surface of the wafer up to a second temperature higher than the first temperature,
      wherein the temperature of at least a portion of the single wafer heat treatment chamber is kept at a third temperature lower than the second temperature, so as to prevent moisture condensation from taking place.

2. A method for fabricating a semiconductor integrated circuit device as claimed in claim 1, wherein said at least a portion of the single wafer heat treatment chamber, which is kept at the third temperature, includes a moisture inlet portion.

3. A method for fabricating a semiconductor integrated circuit device as claimed in claim 1, wherein said at least a portion of the single wafer heat treatment chamber, which is kept at the third temperature, includes a wafer inlet portion.

4. A method for fabricating a semiconductor integrated circuit device as claimed in claim 1, wherein said at least a portion of the single wafer heat treatment chamber, which is kept at the third temperature, includes a central portion thereof where the wafer is placed and processed.

5. A method for fabricating a semiconductor integrated circuit device as claimed in claim 1, wherein the synthesized moisture to be transferred into the single wafer heat treatment chamber is pre-heated up to the third temperature prior to transfer into the single wafer heat treatment chamber.

6. A method for fabricating a semiconductor integrated circuit device as claimed in claim 1, wherein the wafer to be introduced into the single wafer heat treatment chamber is pre-heated up to the third temperature prior to introduction into the single wafer heat treatment chamber.

7. A method for fabricating a semiconductor integrated circuit device as claimed in claim 1, wherein the second temperature is not lower than 700° C.

8. A method for fabricating a semiconductor integrated circuit device as claimed in claim 7, wherein the first temperature is not higher than 500° C.

9. A method for fabricating a semiconductor integrated circuit device as claimed in claim 8, wherein the third temperature is about 140° C.

10. A method for fabricating a semiconductor integrated circuit device as claimed in claim 4, wherein the second temperature is not lower than 700° C.

11. A method for fabricating a semiconductor integrated circuit device as claimed in claim 10, wherein the first temperature is not higher than 500° C.

12. A method for fabricating a semiconductor integrated circuit device as claimed in claim 11, wherein the third temperature is about 140° C.

13. A method for fabricating a semiconductor integrated circuit device as claimed in claim 11, wherein said at least a portion of the single wafer heat treatment chamber, which is kept at the third temperature, includes a moisture inlet portion.

14. A method for fabricating a semiconductor integrated circuit device as claimed in claim 13, wherein said at least a portion of the single wafer heat treatment chamber, which is kept at the third temperature, includes a wafer inlet potion.

15. A method for fabricating a semiconductor integrated circuit device as claimed in claim 14, wherein the moisture to be transferred into the single wafer heat treatment chamber is pre-heated up to the third temperature prior to transfer into the single wafer heat treatment chamber.

16. A method for fabricating a semiconductor integrated circuit device as claimed in claim 15, wherein said at least a portion of the single wafer heat treatment chamber, which is kept at the third temperature, includes a central portion thereof where the wafer is placed and processed.

17. A method for fabricating a semiconductor integrated circuit device as claimed in claim 16, wherein the silicon member is the first major surface of the wafer.

18. A method for fabricating a semiconductor integrated circuit device, comprising the steps of:
   (a) synthesizing moisture, at a first temperature, from oxygen gas and hydrogen gas by use of a catalyst in a moisture synthesizing portion, to produce synthesized moisture;
   (b) transferring the synthesized moisture into a single wafer heat treatment chamber of an oxidation furnace, to form a wet oxidative atmosphere over a first major surface of a wafer inside the chamber, while keeping the moisture in a gaseous state, at least a portion of said single wafer heat treatment chamber being pre-heated up to a second temperature so as to prevent moisture condensation from taking place; and
   (c) performing thermal oxidation treatment of a silicon member over the first major surface of the wafer, in the wet oxidative atmosphere in the single wafer heat treatment chamber, by lamp-heating the first major surface of the wafer up to a third temperature higher than the first and second temperatures.

19. A method for fabricating a semiconductor integrated circuit device as claimed in claim 18, wherein said at least a portion of the single wafer heat treatment chamber, which is kept at the second temperature, includes a moisture inlet portion.

20. A method for fabricating a semiconductor integrated circuit device as claimed in claim 18, wherein said at least a portion of the single wafer heat treatment chamber, which is kept at the second temperature, includes a wafer inlet portion.

21. A method for fabricating a semiconductor integrated circuit device as claimed in claim 18, wherein said at least a portion of the single wafer heat treatment chamber, which is kept at the second temperature, includes a central portion thereof where the wafer is placed and processed.

22. A method for fabricating a semiconductor integrated circuit device as claimed in claim 18, wherein the synthesized moisture to be transferred into the single wafer heat treatment chamber is pre-heated up to the second temperature prior to transfer into the single wafer heat treatment chamber.

23. A method for fabricating a semiconductor integrated circuit device as claimed in claim 18, wherein the wafer to be introduced into the single wafer heat treatment chamber is pre-heated up to the second temperature prior to introduction into the single wafer heat treatment chamber.

24. A method for fabricating a semiconductor integrated circuit device as claimed in claim 18, wherein the third temperature is not lower than 700° C.

25. A method for fabricating a semiconductor integrated circuit device as claimed in claim 24, wherein the first temperature is not higher than 500° C.

26. A method for fabricating a semiconductor integrated circuit device as claimed in claim 25, wherein the second temperature is about 140° C.

27. A method for fabricating a semiconductor integrated circuit device as claimed in claim 21, wherein the third temperature is not lower than 700° C.

28. A method for fabricating a semiconductor integrated circuit device as claimed in claim 27, wherein the first temperature is not higher than 500° C.

29. A method for fabricating a semiconductor integrated circuit device as claimed in claim 28, wherein the second temperature is about 140° C.

30. A method for fabricating a semiconductor integrated circuit device as claimed in claim 28, wherein said at least a portion of the single wafer heat treatment chamber, which is kept at the second temperature, includes a moisture inlet portion.

31. A method for fabricating a semiconductor integrated circuit device as claimed in claim 30, wherein said at least a portion of the single wafer heat treatment chamber, which is kept at the second temperature, includes a wafer inlet portion.

32. A method for fabricating a semiconductor integrated circuit device as claimed in claim 31, wherein the synthesized moisture to be transferred into the single wafer heat treatment chamber is pre-heated up to the second temperature prior to transfer into the single wafer heat treatment chamber.

33. A method for fabricating a semiconductor integrated circuit device as claimed in claim 32, wherein said at least a portion of the single wafer heat treatment chamber, which is kept at the second temperature, includes a central portion thereof where the wafer is placed and processed.

34. A method for fabricating a semiconductor integrated circuit device as claimed in claim 33, wherein the silicon member is the first major surface of the wafer.

35. A method for fabricating a semiconductor integrated circuit device, comprising the steps of:
  (a) synthesizing moisture, at a first temperature, from oxygen gas and hydrogen gas by use of a catalyst in a moisture synthesizing portion, to produce synthesized moisture;
  (b) transferring the synthesized moisture through a gas inlet tube, the temperature of which is kept at a second temperature so as to prevent moisture condensation from taking place, the synthesized moisture being transferred into a heat treatment chamber of an oxidation furnace to form a wet oxidative atmosphere over a first major surface of a wafer inside the chamber, while keeping the moisture in a gaseous state; and
  (c) performing thermal oxidation treatment of a silicon member over the first major surface of the wafer, in the wet oxidative atmosphere in the heat treatment chamber, by heating the first major surface of the wafer up to a third temperature higher than the first and second temperatures.

36. A method for fabricating a semiconductor integrated circuit device as claimed in claim 35, wherein the heating up to the third temperature is performed by lamp heating.

37. A method for fabricating a semiconductor integrated circuit device as claimed in claim 36, wherein the third temperature is not lower than 700° C.

38. A method for fabricating a semiconductor integrated circuit device as claimed in claim 37, wherein the first temperature is not higher than 500° C.

39. A method for fabricating a semiconductor integrated circuit device as claimed in claim 38, wherein the heat treatment chamber is a single wafer heat treatment chamber.

40. A method for fabricating a semiconductor integrated circuit device as claimed in claim 39, wherein the first temperature ranges about from 350° to 450° C.

41. A method for fabricating a semiconductor integrated circuit device as claimed in claim 40, wherein the second temperature is about 140° C.

42. A method for fabricating a semiconductor integrated circuit device as claimed in claim 41, wherein the silicon member is the first major surface of the wafer.

43. A method for fabricating a semiconductor integrated circuit device, comprising the steps of:
  (a) synthesizing moisture, at a first temperature, from oxygen gas and hydrogen gas by use of a catalyst in a moisture synthesizing portion, to produce synthesized moisture;
  (b) transferring the synthesized moisture through a gas inlet tube, the temperature of which is kept at a second temperature so as to prevent moisture condensation from taking place, the synthesized moisture being transferred into a heat treatment chamber of an oxidation furnace to form a wet oxidative atmosphere over a first major surface of a wafer inside the chamber, while keeping the moisture in a gaseous state, the heat treatment chamber being preheated to a third temperature; and
  (c) performing thermal oxidation treatment of a silicon member over the first major surface of the wafer, in the wet oxidative atmosphere in the heat treatment chamber, by heating the first major surface of the wafer up to a fourth temperature higher than the first, second and third temperatures.

44. A method for fabricating a semiconductor integrated circuit device as claimed in claim 43, wherein the heating up to the fourth temperature is performed by lamp heating.

45. A method for fabricating a semiconductor integrated circuit device as claimed in claim 44, wherein the fourth temperature is not lower than 700° C.

46. A method for fabricating a semiconductor integrated circuit device as claimed in claim 45, wherein the first temperature is not higher than 500° C.

47. A method for fabricating a semiconductor integrated circuit device as claimed in claim 46, wherein the heat treatment chamber is a single wafer heat treatment chamber.

48. A method for fabricating a semiconductor integrated circuit device as claimed in claim 47, wherein at least a portion of the heat treatment chamber is kept at the third temperature, said at least a portion including a moisture inlet portion.

49. A method for fabricating a semiconductor integrated circuit device as claimed in claim 48, wherein at least a portion of the heat treatment chamber is kept at the third temperature, said at least a portion including a wafer inlet portion.

50. A method for fabricating a semiconductor integrated circuit device as claimed in claim 49, wherein at least a portion of the heat treatment chamber is kept at the third temperature, said at least a portion including a central portion thereof where the wafer is placed and processed.

51. A method for fabricating a semiconductor integrated circuit device as claimed in claim 50, wherein the synthesized moisture to be transferred into the heat treatment chamber is pre-heated up to the third temperature prior to transfer into the single wafer heat treatment chamber.

52. A method for fabricating a semiconductor integrated circuit device as claimed in claim 51, wherein the wafer to be introduced into the heat treatment chamber is pre-heated up to the third temperature prior to introduction into the single wafer heat treatment chamber.

53. A method for fabricating a semiconductor integrated circuit device as claimed in claim 52, wherein the first temperature ranges about from 350° to 450° C.

54. A method for fabricating a semiconductor integrated circuit device as claimed in claim 53, wherein the third temperature is about 140° C.

55. A method for fabricating a semiconductor integrated circuit device as claimed in claim 54, wherein the silicon member is the first major surface of the wafer.

56. A method for fabricating a semiconductor integrated circuit device, comprising the steps of:
  (a) synthesizing moisture, at a first temperature, from oxygen gas and hydrogen gas by use of a catalyst in a moisture synthesizing portion, to produce synthesized moisture;
  (b) transferring the synthesized moisture through a gas inlet tube, the temperature of which is kept at a second temperature so as to prevent moisture condensation from taking place, the synthesized moisture being transferred into a heat treatment chamber of an oxidation furnace to form a wet oxidative atmosphere over a first major surface of a wafer inside the chamber, while keeping the moisture in a gaseous state, the heat treatment chamber being preheated to a third temperature; and
  (c) performing thermal oxidation treatment of a silicon member over the first major surface of the wafer, in the wet oxidative atmosphere in the heat treatment chamber, by heating the first major surface of the wafer up to a fourth temperature higher than the first, second and third temperatures.

57. A method for fabricating a semiconductor integrated circuit device as claimed in claim 56, wherein the heating up to the fourth temperature is performed by lamp heating.

58. A method of fabricating a semiconductor integrated circuit device as claimed in claim 57, wherein the fourth temperature is not lower than 700° C.

59. A method for fabricating a semiconductor integrated circuit device as claimed in claim 58, wherein the first temperature is not higher than 500° C.

60. A method for fabricating a semiconductor integrated circuit device as claimed in claim 59, wherein the heat treatment chamber is a single wafer heat treatment chamber.

61. A method for fabricating a semiconductor integrated circuit device as claimed in claim 60, wherein at least a portion of the heat treatment chamber is kept at the third temperature, said at least a portion including a moisture inlet portion.

62. A method for fabricating a semiconductor integrated circuit device as claimed in claim 61, wherein at least a portion of the heat treatment chamber is kept at the third temperature, said at least a portion including a wafer inlet portion.

63. A method for fabricating a semiconductor integrated circuit device as claimed in claim 62, wherein at least a portion of the heat treatment chamber is kept at the third temperature, said at least a portion including a central portion thereof where the wafer is placed and processed.

64. A method for fabricating a semiconductor integrated circuit device as claimed in claim 63, wherein the synthesized moisture to be transferred into the heat treatment chamber is pre-heated up to the third temperature prior to transfer into the single wafer heat treatment chamber.

65. A method for fabricating a semiconductor integrated circuit device as claimed in claim 64, wherein the wafer to be introduced into the heat treatment chamber is pre-heated up to the third temperature prior to introduction into the single wafer heat treatment chamber.

66. A method for fabricating a semiconductor integrated circuit device as claimed in claim 65, wherein the first temperature ranges about from 350° to 450° C.

67. A method for fabricating a semiconductor integrated circuit device as claimed in claim 66, wherein the third temperature is about 140° C.

* * * * *